United States Patent
Son et al.

(10) Patent No.: US 11,430,847 B2
(45) Date of Patent: Aug. 30, 2022

(54) CRYSTALLINE SEMICONDUCTOR AND OXIDE SEMICONDUCTOR THIN-FILM TRANSISTOR DEVICE AND METHOD OF MANUFACTURING THE SAME

(71) Applicant: SAMSUNG DISPLAY CO., LTD, Yongin-si (KR)

(72) Inventors: Kyoungseok Son, Seoul (KR); Jaybum Kim, Seoul (KR); Eoksu Kim, Seoul (KR); Junhyung Lim, Seoul (KR); Jihun Lim, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 39 days.

(21) Appl. No.: 16/820,102

(22) Filed: Mar. 16, 2020

(65) Prior Publication Data
US 2020/0219953 A1 Jul. 9, 2020

Related U.S. Application Data

(63) Continuation of application No. 15/683,121, filed on Aug. 22, 2017, now Pat. No. 10,615,234.

(30) Foreign Application Priority Data

Aug. 30, 2016 (KR) .......................... 10-2016-0111011

(51) Int. Cl.
*H01L 27/32* (2006.01)
*H01L 21/02* (2006.01)
(Continued)

(52) U.S. Cl.
CPC .... *H01L 27/3262* (2013.01); *H01L 21/02164* (2013.01); *H01L 21/02178* (2013.01);
(Continued)

(58) Field of Classification Search
CPC ............ H01L 27/3262; H01L 27/3258; H01L 27/3265; H01L 27/127; H01L 27/1255;
(Continued)

(56) References Cited

U.S. PATENT DOCUMENTS 9,129,927 B2 9/2015 Gupta et al.
10,249,695 B2 4/2019 Ono et al.
(Continued)

FOREIGN PATENT DOCUMENTS

KR 10-2015-0051824 5/2015
KR 10-2016-0043327 4/2016

*Primary Examiner* — Thao X Le
*Assistant Examiner* — Gardner W. S. Swan
(74) *Attorney, Agent, or Firm* — F. Chau & Associates, LLC

(57) ABSTRACT

A method of manufacturing a semiconductor device. A pre first semiconductor pattern having a crystalline semiconductor material is formed on a base substrate. A pre first insulation layer is formed on the pre first semiconductor pattern. A first semiconductor pattern is formed by defining a channel region in the pre first semiconductor pattern. A pre protection layer is formed on the pre first insulation layer. A pre second semiconductor pattern including an oxide semiconductor material is formed on the pre protection layer. A pre second insulation layer is formed on the pre second semiconductor pattern. The pre second insulation layer is patterned using an etching gas such that at least a portion of the pre second semiconductor pattern is exposed. A second semiconductor pattern is formed by defining a channel region in the pre second semiconductor pattern. The pre protection layer has a material with a first etch selectivity that is different from a second etch selectivity of the second insulation layer with respect to the etching gas.

4 Claims, 19 Drawing Sheets

(51) Int. Cl.
  *H01L 21/4757* (2006.01)
  *H01L 29/66* (2006.01)
  *H01L 29/786* (2006.01)
  *H01L 27/12* (2006.01)
  *H01L 49/02* (2006.01)
  *H01L 29/24* (2006.01)

(52) U.S. Cl.
  CPC .... *H01L 21/47573* (2013.01); *H01L 27/3258* (2013.01); *H01L 27/3265* (2013.01); *H01L 29/66757* (2013.01); *H01L 29/66969* (2013.01); *H01L 29/7869* (2013.01); *H01L 29/78675* (2013.01); *H01L 27/127* (2013.01); *H01L 27/1222* (2013.01); *H01L 27/1225* (2013.01); *H01L 27/1248* (2013.01); *H01L 27/1255* (2013.01); *H01L 27/1262* (2013.01); *H01L 28/60* (2013.01); *H01L 29/24* (2013.01); *H01L 2227/323* (2013.01)

(58) Field of Classification Search
  CPC ............. H01L 27/1222; H01L 27/1225; H01L 27/1248; H01L 27/1262; H01L 29/78675; H01L 29/66757; H01L 29/66969; H01L 29/7869; H01L 29/24; H01L 21/02164; H01L 21/02178; H01L 21/47573; H01L 28/60; H01L 2227/323
  USPC ........................................................ 257/43
  See application file for complete search history.

(56) References Cited

U.S. PATENT DOCUMENTS

| | | |
|---|---|---|
| 2010/0044702 A1 | 2/2010 | Urayama et al. |
| 2011/0254098 A1 | 10/2011 | Wong et al. |
| 2015/0123084 A1 | 5/2015 | Kim et al. |
| 2016/0087022 A1 | 3/2016 | Tsai et al. |
| 2018/0061920 A1 | 3/2018 | Son et al. |

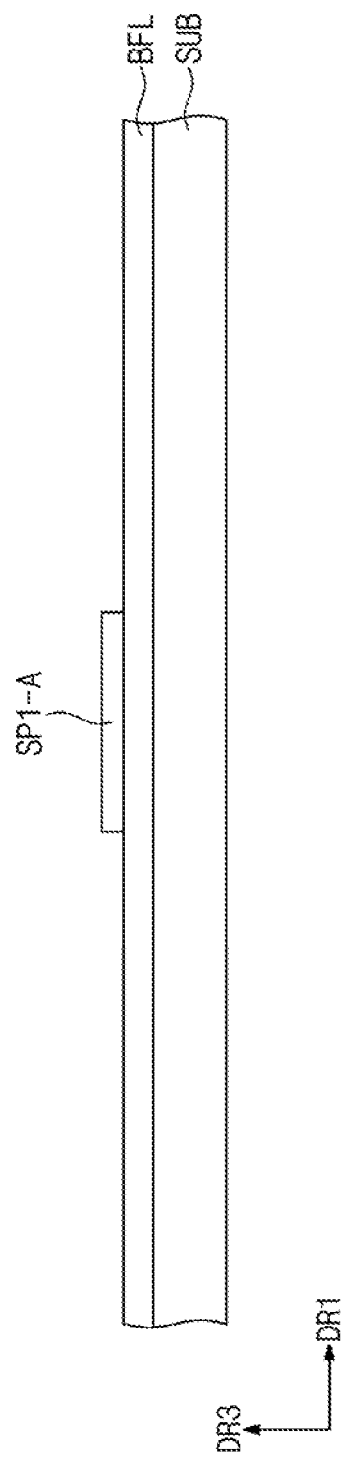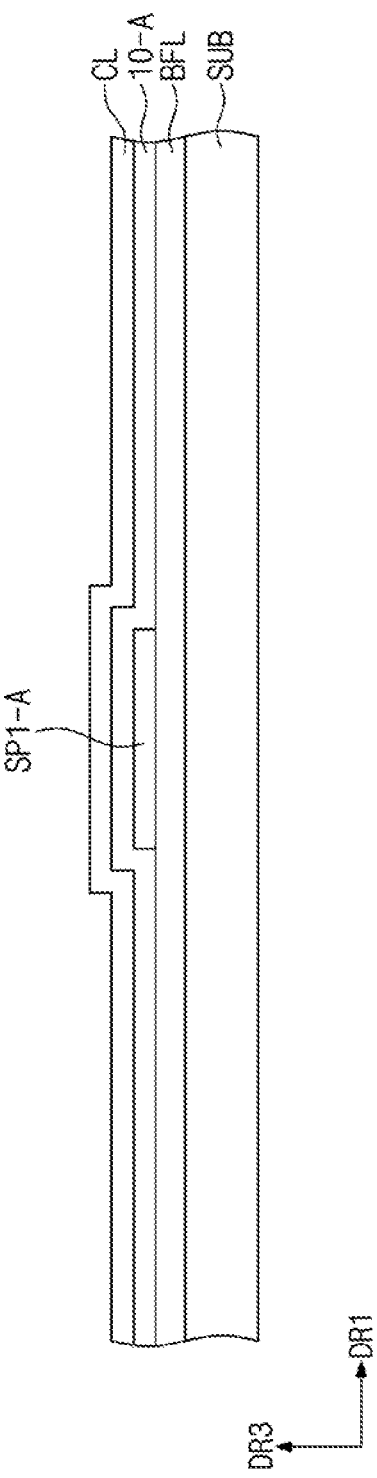

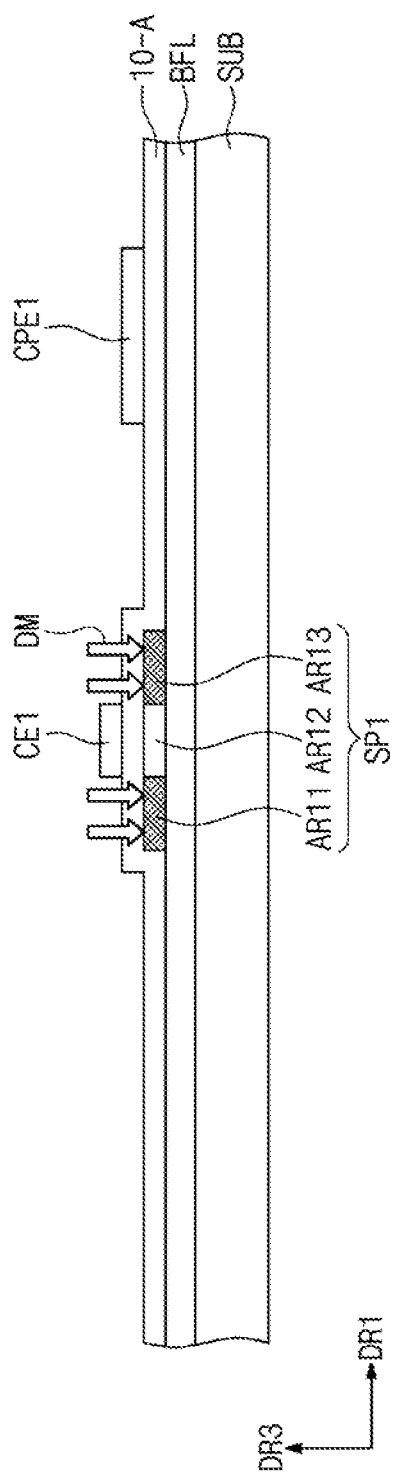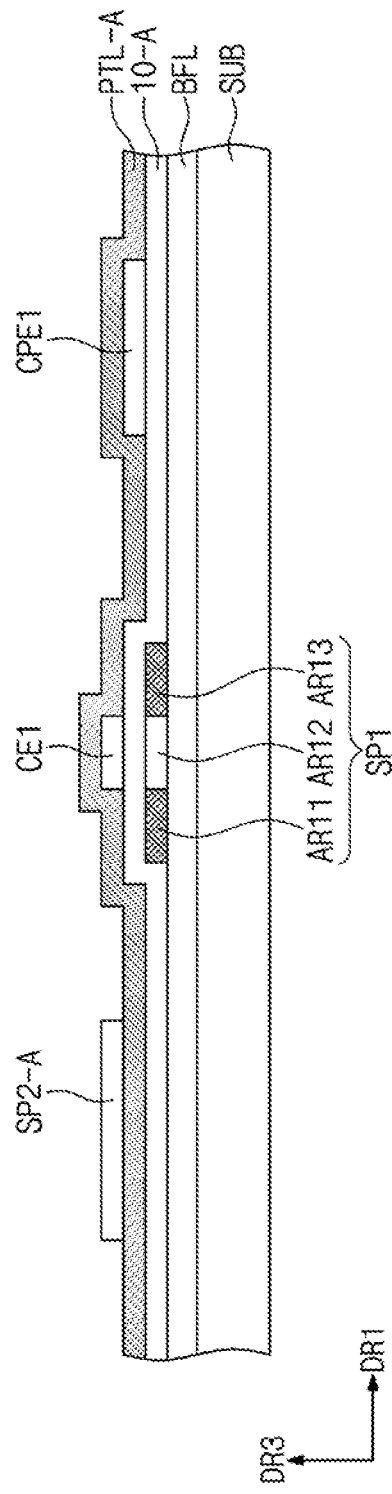

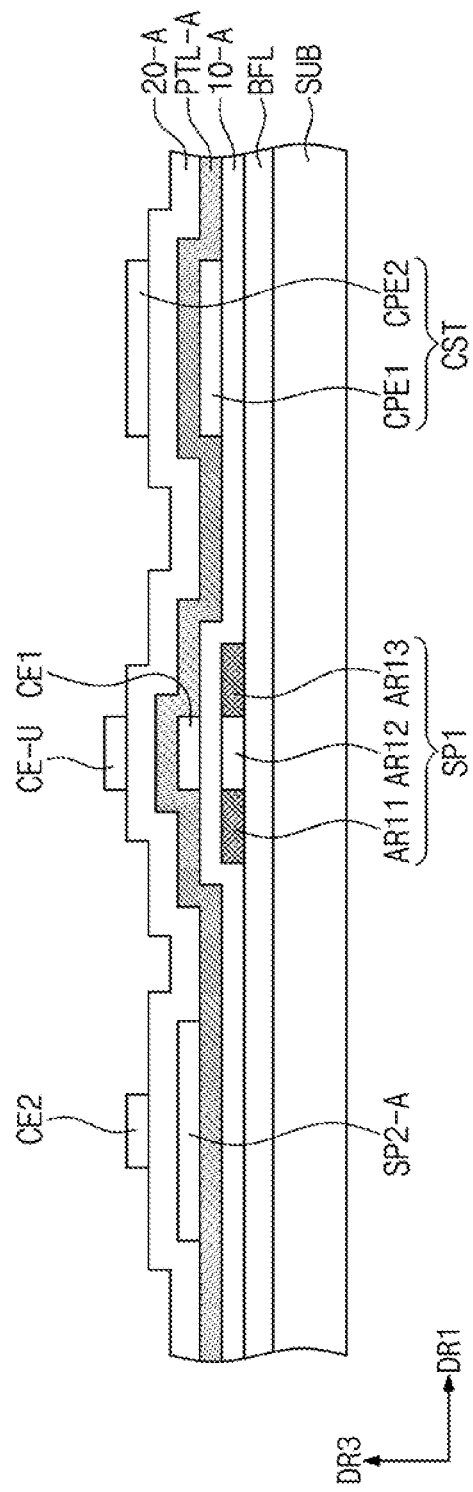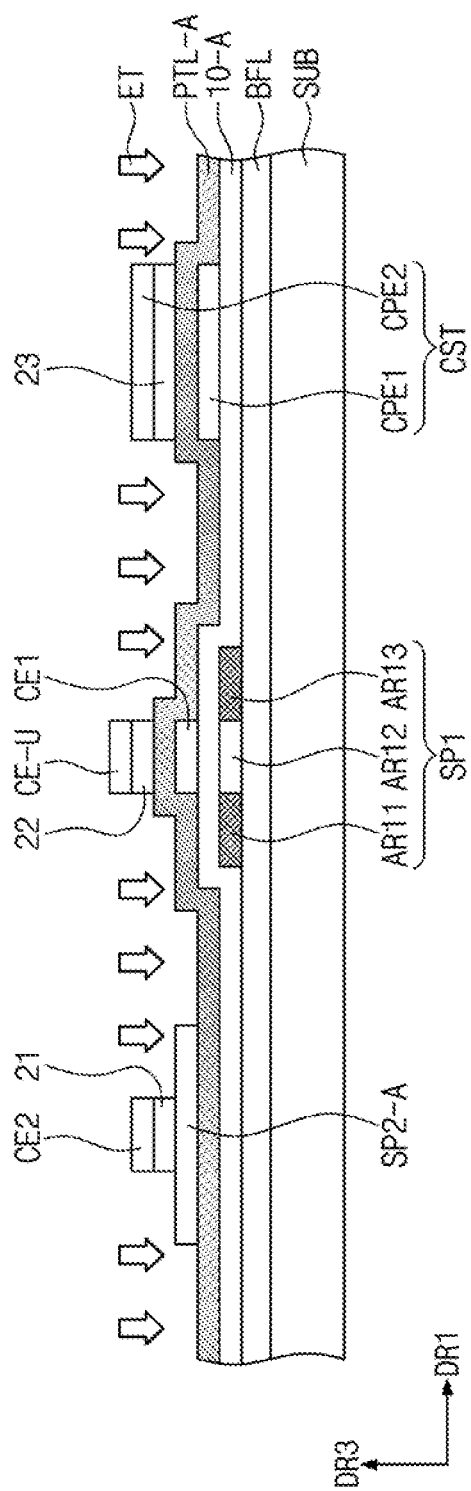

CRYSTALLINE SEMICONDUCTOR AND OXIDE SEMICONDUCTOR THIN-FILM TRANSISTOR DEVICE AND METHOD OF MANUFACTURING THE SAME

CROSS-REFERENCE TO RELATED APPLICATION

This application is a continuation of U.S. patent application Ser. No. 15/683,121, filed on Aug. 22, 2017 in the U.S. Patent and Trademark Office, which claims priority under 35 U.S.C. § 119 of Korean Patent Application No. 10-2016-0111011, filed on Aug. 30, 2016, in the Korean Intellectual Property Office, the disclosures of both of which are incorporated by reference herein in their entireties.

TECHNICAL FIELD

Exemplary embodiments of the present inventive concept relate to a semiconductor device and a method of manufacturing the same. More particularly, exemplary embodiments relate to a semiconductor device with improved reliability and a method of manufacturing the same.

DISCUSSION OF THE RELATED ART

A semiconductor device includes at least one thin film transistor. The thin film transistor may include a semiconductor pattern made of a semiconductor material. A display device as an embodiment of a semiconductor device may include a plurality of pixels, and at least one driving circuit for controlling the plurality of pixels. The driving circuit may include at least one thin film transistor. The thin film transistors included in the driving circuit may provide electric signals for controlling the plurality of pixels.

Each of the pixels may include a pixel driving circuit and a display element connected to the pixel driving circuit. The pixel driving circuit may include at least one thin film transistor and a capacitor. The thin film transistor and the capacitor constituting the pixel driving circuit may control the display element according to an electric signal provided from the pixel driving circuit.

SUMMARY

According to an exemplary embodiment of the present inventive concept, a method of manufacturing a semiconductor device includes forming a pre first semiconductor pattern having a crystalline semiconductor material on a base substrate, and forming a pre first insulation layer on the pre first semiconductor pattern. The method further includes forming a first semiconductor pattern by defining a channel region in the pre first semiconductor pattern, and forming a pre protection layer on the first insulation layer. The method still further includes forming a pre second semiconductor pattern having an oxide semiconductor material on the pre protection layer, and forming a pre second insulation layer on the pre second semiconductor pattern. The method further includes patterning the pre second insulation layer using an etching gas such that at least a portion of the pre second semiconductor pattern is exposed, and forming a second semiconductor pattern by defining a channel region in the pre second semiconductor pattern. The pre protection layer has a material with a first etch selectivity that is different from a second etch selectivity of the pre second insulation layer with respect to the etching gas.

According to an exemplary embodiment of the present inventive concept, a semiconductor device includes a base substrate; and a first transistor disposed on the base substrate. The first transistor has a first input electrode, a first output electrode, a first control electrode, and a first semiconductor pattern. The first semiconductor pattern includes a crystalline semiconductor. The semiconductor device further includes a second transistor disposed on the base substrate. The second transistor has a second input electrode, a second output electrode, a second control electrode, and a second semiconductor pattern. The second semiconductor pattern includes an oxide semiconductor. The semiconductor device still further includes a first insulation layer and a second insulation layer. The first insulation layer and the second insulation layer are disposed on the base substrate. The semiconductor device further includes a protection layer disposed between the first semiconductor pattern and the second semiconductor pattern and having a metal oxide.

According to an exemplary embodiment of the present inventive concept, a semiconductor device comprises a base substrate, a first semiconductor pattern disposed on the base substrate, the first semiconductor pattern comprising a first channel region and a plurality of first non-channel regions, the first channel region including a crystalline semiconductor, a second semiconductor pattern disposed on the base substrate, the second semiconductor pattern comprising a second channel region and a plurality of second non-channel regions, the second channel region including an oxide semiconductor, a first insulation layer disposed on the base substrate, a protection layer disposed on the first insulation layer, and an organic light emitting diode comprising a first electrode, a second electrode, and at least one light emitting layer.

The first insulation layer is disposed between first semiconductor pattern and the second semiconductor pattern, and the protection layer is disposed between the first semiconductor pattern and the second semiconductor pattern.

The semiconductor device according to an embodiment of the present inventive concept may further comprise a first control electrode disposed between the first insulation layer and the protection layer, and a second control electrode disposed on the second semiconductor pattern.

The semiconductor device according to an embodiment of the present inventive concept may further comprises a first input electrode and a first output electrode connected to one of the plurality of first non-channel regions, respectively, a second input electrode and a second output electrode connected to one of the plurality of second non-channel regions, respectively, the organic light emitting diode connected to at least one of the first input electrode, the first output electrode, the second input electrode, or the second output electrode.

In an embodiment, the protection layer includes a material with a first etch rate, and the first insulation layer includes a material with a second etch rate, the second etch rate being different from the first etch rate for an etching gas.

In an embodiment, the crystalline semiconductor includes a polycrystalline silicon, and the oxide semiconductor includes at least one of zinc, indium, gallium, tin, or titanium.

The semiconductor device according to an embodiment of the present inventive concept may further comprises a first capacitor electrode disposed on the first insulation layer, and a second capacitor electrode positioned on the protection layer relative to the first capacitor electrode to form an electric field therebetween.

In an embodiment, the first capacitor electrode and the first control electrode are electrically connected to each other.

BRIEF DESCRIPTION OF THE FIGURES

The above and other features of the inventive concept will become more apparent by describing in detail exemplary embodiments thereof, with reference to the accompanying drawing, which:

FIGS. 5A through 5M are cross-sectional views showing a method of manufacturing a semiconductor device according to exemplary embodiments of the present inventive concept.

DETAILED DESCRIPTION

Exemplary embodiments of the present inventive concept will be described more fully with reference to the accompanying drawings. The present disclosure may, however, be embodied in many different forms and should not be construed as limited to the embodiments set forth herein. It will be understood that when an element is referred to as being "connected" to another element, it can be directly connected to the other element or intervening element may be present.

Figure 1:
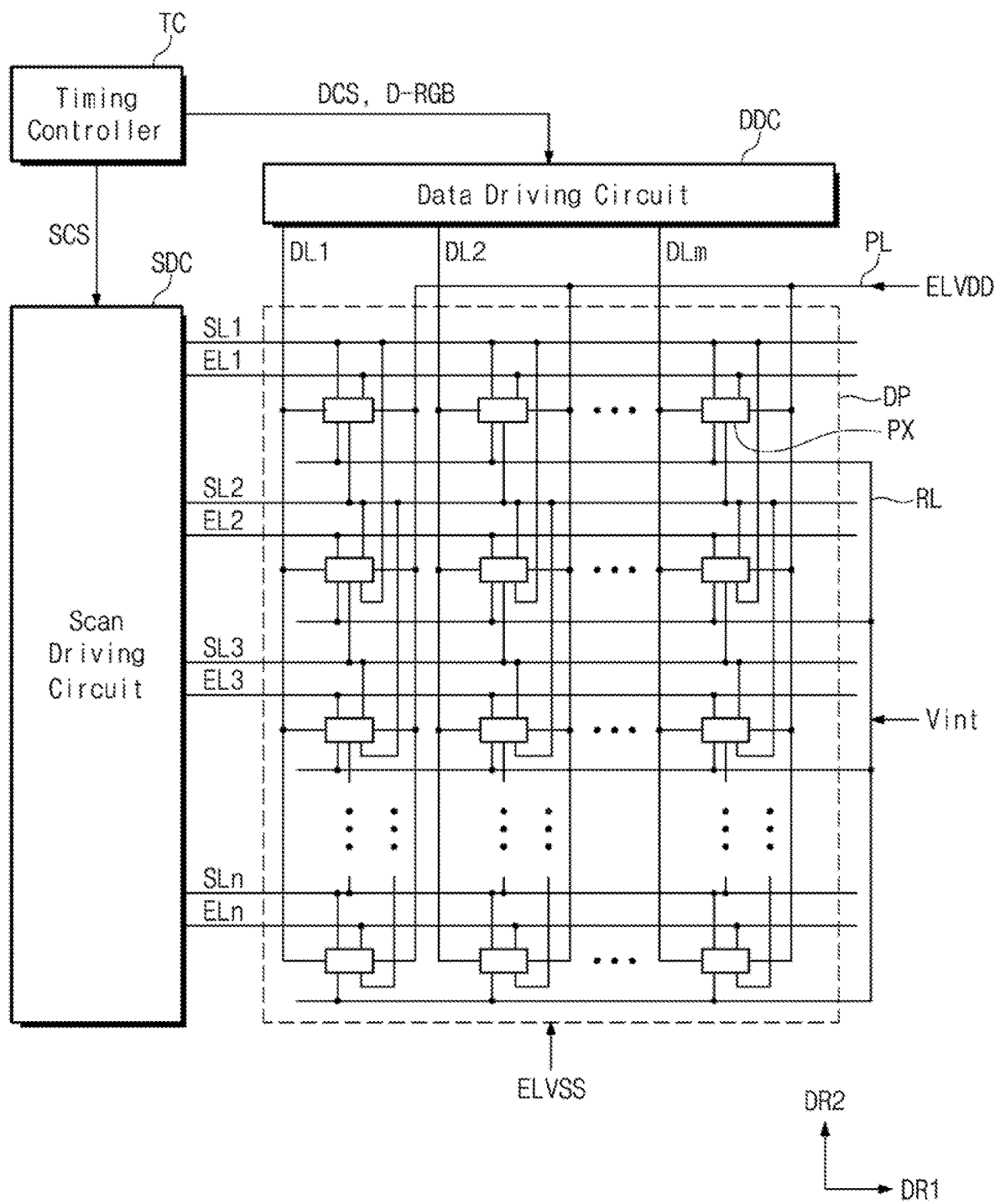
FIG. 1 is a block diagram of a semiconductor device according to an exemplary embodiment of the present inventive concept.

FIG. 1 is a block diagram of a semiconductor device according to an exemplary embodiment of the present inventive concept. The semiconductor device may include at least one semiconductor pattern. In FIG. 1, a display device is shown as an exemplary embodiment of the semiconductor device. Hereinafter, a display device will be described as an exemplary embodiment. However, a semiconductor device according to an exemplary embodiment of the present inventive concept may include various exemplary embodiments, and is not limited to any one exemplary embodiment.

As shown in FIG. 1, a display device includes a timing controller TC, a scan driving circuit SDC, a data driving circuit DDC, and a display panel DP. The display panel displays an image according to an electric signal.

The timing controller TC may receive input image signals (now shown), may convert data formats of the input image signals to other data formats to meet interface specifications with the scan driving circuit SDC, and may generate image data D-RGB. The timing controller TC may output the image data D-RGB and various control signals including a digital control circuit DCS and a scan control signal SCS.

The scan driving circuit SDC may receive the scan control signal SCS from the timing controller TC. The scan control signal SCS may include a vertical start signal for operating the scan driving circuit SDC, and a clock signal for determining timing outputting signals.

The scan driving circuit SDC may generate a plurality of scan signals, and sequentially outputs the scan signals to a plurality of scan lines SL1 to SLn. Also, the scan driving circuit SDC may generate a plurality of light emitting control signals in response to the scan control signal SCS, and may output the light emitting control signals to a plurality of light emitting lines EL1 to ELn.

In FIG. 1, the scan signals and the light emitting control signals are illustrated to be outputted from one scan driving circuit SDC. However, the present inventive concept is not limited thereto. In an exemplary embodiment of the present inventive concept, scan driving circuits SDCs may divide and output scan signals, and may divide and output light emitting control signals. Also, in an exemplary embodiment of the present inventive concept, a driving circuit which generates and outputs scan signals, and a driving circuit which generates and outputs light emitting control signals may be considered to be separate from each other.

The data driving circuit DDC may receive a data control signal DCS and image data D-RGB from the timing controller TC. The data driving circuit may convert the image data D-RGB to data signals, and may output the data signals to data lines DL1 to DLm. The data signals may be analogue voltages corresponding to grey scale values of the image data D-RGB.

The display panel DP may include the scan lines SL1 to SLn, the light emitting lines EL1 to ELn, the data lines DL1 to DLm, and pixels PX. The scan lines SL to SLn may be extended in a first direction DR1, and arranged in a second direction DR2 which crosses the first direction DR1.

Each of the plurality of light emitting lines EL1 to ELn may be arranged in parallel to a corresponding scan line among the scan lines SL1 to SLn. The data lines DL1 to DLm may cross the scan lines SL1 to SLn while being insulated therefrom.

Each of the plurality of pixels may be connected to a corresponding scan line among the scan lines SL1 to SLn, to a corresponding light emitting line among the light emitting lines EL1 to ELn, and to a corresponding data line among the data lines DL1 to DLm.

Each of the pixels PX may receive a first voltage ELVDD corresponding to a power voltage, and a second voltage ELVSS which may be lower in level than the first voltage ELVDD. Each of the pixels PX may be connected to a power line PL having the first voltage ELVDD applied thereto. Each of the pixels PX may be connected to an initialization line RL receiving an initialization voltage Vint.

Each of the pixels PX may be electrically connected to three scan lines. As shown in FIG. 1, pixels in the second pixel line may be connected to the first to third scan lines SL1 to SL3.

Although not shown, the display panel DP may further include a plurality of dummy scan lines. The display panel DP may still further include a dummy scan line connected to pixels PX in the first pixel line, and a dummy scan line connected to pixels PX in the $n^{th}$ pixel line. Also, pixels (hereinafter, pixels in pixel lines) connected to one data line among the data lines DL1 to DLm may be connected to each other. Two adjacent pixels among pixels in pixel lines, may be electrically connected.

Each of the plurality of pixels PX may include an organic light emitting diode (now shown), and a pixel driving circuit (not shown) configured to control light emission of the organic light emitting diode. The pixel driving circuit may include a plurality of thin film transistors, and a capacitor. At least one of the scan driving circuit SDC or the data driving circuit DDC may include thin film transistors formed though substantially the same process for a pixel driving circuit.

Through a plurality of a photolithography process, the scan lines SL1 to SLn, the light emitting lines EL1 to ELn, the data lines DL1 to DLm, the power line PL, the initialization line RL, the pixels PX, the scan driving circuit SDC, and the data driving circuit DDC may be formed on a base substrate (not shown). Through a plurality of a deposition process or a coating process, insulation layers may be formed on the base substrate (not shown). Each of the insulation layers may be a thin film covering the display panel DP substantially entirely, or may include at least one insulation pattern overlapping a specific component of the display panel DP. The insulation layers may include an organic layer and/or an inorganic layer. In addition, an encapsulation layer (not shown) protecting the pixels PX may further be provided on the base substrate.

Figure 2:
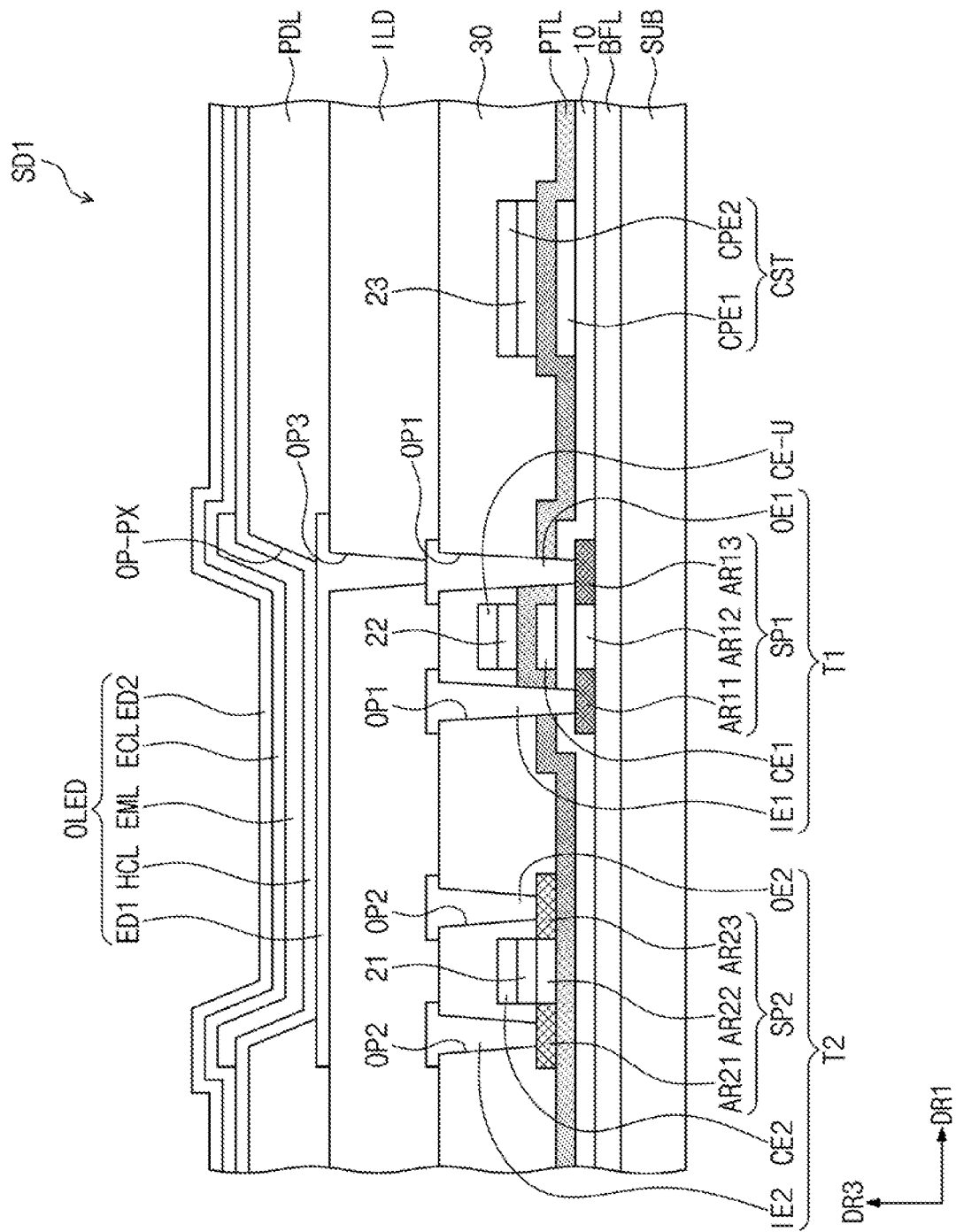
FIG. 2 is a cross-sectional view showing a portion of a semiconductor device according to an exemplary embodiment of the present inventive concept.

FIG. 2 is a cross-sectional view showing a portion of a semiconductor device according to an exemplary embodiment of the present inventive concept. FIG. 2 shows a portion of a pixel among the pixels PX illustrated in FIG. 1. Hereinafter, referring to FIG. 2, a semiconductor device SD1 will be described.

The semiconductor device SD1 may include a base substrate SUB, a first transistor T1, a second transistor T2, a capacitor CST, and an organic light emitting diode OLED. The upper surface of the base substrate SUB may be defined by the first direction DR1 (See, for example, FIG. 1) and the second direction DR2 (See, for example, FIG. 1).

The first transistor T1 may include a first input electrode IE1, a first output electrode OE1, a first control electrode CE1, and a first semiconductor pattern SP1. The first transistor T1 may be a driving transistor connected to the organic light emitting diode OLED. The second transistor T2 may include a second input electrode IE2, a second output electrode OE2, a second control electrode CE2, and a second semiconductor pattern SP2. The second transistor T2 may be a control transistor to turn on a pixel PX.

The capacitor CST may include a first capacitor electrode CPE1 and a second capacitor electrode CPE2. The first capacitor electrode CPE1 and the second capacitor electrode CEP2 may be disposed with an insulation film in between while being spaced apart from each other, for example, as shown in FIG. 2.

The organic light emitting diode OLED may include a first electrode ED1, a first charge control layer HCL, a light emitting layer EML, a second charge control layer ECL, and a second electrode ED2. In this exemplary embodiment, the first electrode ED1, the first charge control layer HCL, the light emitting layer EML, the second charge control layer ECL, and the second electrode ED2 may, respectively, correspond to an anode electrode, a hole control layer, a light emitting layer, an electron control layer, and a cathode electrode of an OLED known by a person of ordinary skill in the art. Meanwhile, the OLED may be illustrated by way of another example. For example, the first electrode ED1, the first charge control layer HCL, the light emitting layer EML, the second charge control layer ECL, and the second electrode ED2 may, respectively, be a cathode electrode, an electron control layer, a light emitting layer, a hole control layer, and an anode electrode of an OLED known by a person of ordinary skill in the art.

The base substrate SUB may be a layer, a film, or a plate on which the first transistor T1, the second transistor T2, and the capacitor CST may be disposed. The base substrate SUB may include a plastic substrate, a glass substrate, a metal substrate, and the like. The plastic substrate may include at least one of an acrylic resin, a methacrylic resin, polyisoprene, a vinyl-based resin, an epoxy-based resin, a urethane-based resin, a cellulose-based resin, a siloxane-based resin, a polyimide-based resin, a polyamide-based resin, or a perylene-based resin.

A buffer layer BFL may be disposed between the upper surface of the base substrate SUB, and the first transistor T1 and the second transistor T2. The buffer layer BFL may improve bonding force between the base substrate SUB and electrically conductive patterns, or semiconductor patterns. The buffer layer BFL may include one of an inorganic material and/or an organic material. Although not shown separately, a barrier layer preventing foreign matters from inflowing may further be disposed on the upper surface of the base substrate SUB. The buffer layer BFL and the barrier layer may selectively be disposed, or omitted.

On the buffer layer BFL, the first semiconductor pattern SP1 may be disposed. The first semiconductor pattern SP1 may include a crystalline semiconductor material. For example, the first semiconductor pattern SP1 may include a polycrystalline semiconductor material such as polycrystalline silicon.

The first semiconductor pattern SP1 may be divided into a first area AR11 and a third area AR13 with both the first area AR11 and the third areas AR13 including impurities, and a second area AR12 which is positioned right next to the first area AR11 and the third area AR13. The first semiconductor pattern SP1 may be a p-type or an n-type depending on a type of impurities.

The first area AR1 may be connected to the first input electrode IE1, and the third area AR13 may be connected to the first output electrode OE1. The second area AR12 may be disposed between the first area AR11 and the third area AR13, and may overlap the first control electrode CE1 when viewed in a plane in the third direction DR3. The second area AR12 may be a channel region of the first transistor T1.

The channel region of the first transistor T1 may include a polycrystalline semiconductor material. Accordingly, the first transistor T1 may have an improved mobility, and may serve as a driving element having high reliability. In the channel region of the first semiconductor pattern SP1, a hole may move, or an electron may move depending on a structure of the first semiconductor pattern SP1. For example, in the channel region AR12 of the first semiconductor pattern SP1, a hole or an electron may move depending on a structure of the first semiconductor pattern SP1.

A first insulation layer 10 may be disposed on the first semiconductor pattern SP1. The first insulation layer 10 may include at least one of an inorganic material and/or an organic material. For example, the first insulation layer 10 may include a silicon nitride and/or a silicon oxide.

The first insulation layer 10 may be disposed on the buffer layer BFL, and may cover at least a portion of the first semiconductor pattern SP1. Meanwhile, this structure may be illustrated by way of another example. For example, the first insulation layer 10 may be an insulation pattern overlapping the second area AR12 when viewed in a plane in the third direction DR3. The first insulation layer 10, according to an exemplary embodiment of the present inventive concept, may have various shapes, and may not be limited to any one exemplary embodiment.

The first control electrode CE1 and the first capacitor electrode CPE1 may be disposed on the first insulation layer 10. The first control electrode CE1 and the first capacitor electrode CPE1 may be disposed on substantially the same layer.

The first control electrode CE1 may overlap at least the second area AR12. The first control electrode CE1 may be spaced apart from the first semiconductor pattern SP1 by the first insulation layer 10 in-between.

The first capacitor electrode CPE1 may define one electrode of the capacitor CST. In this exemplary embodiment, the first capacitor electrode CPE1 may be electrically connected to the first control electrode CE1. In another exemplary embodiment, the first capacitor electrode CPE1 and the first control electrode CE1 may be a conductive pattern having an integral shape.

As shown in FIG. 2, a protection layer PTL may be disposed on the first control electrode CE1 and the first capacitor electrode CPE1. The protection layer PTL may be disposed on the first insulation layer 10, and may cover the first control electrode CE1 and the first capacitor electrode CPE1. A portion of the protection layer PTL may be in contact with the first insulation layer 10. A portion of the first insulation layer 10 that does not overlap the first control electrode CE1 and the first capacitor electrode CPE1 may be covered by the protection layer PTL.

The protection layer PTL may include at least one of an inorganic material and/or an organic material. The protection layer PTL may include a different material than the first insulation layer 10. For example, the protection layer PTL may include a metal oxide such as an aluminum oxide. The protection layer PTL may protect the first insulation layer 10 in a subsequent process, where a detailed explanation thereof will be described.

A second semiconductor pattern SP2 may be disposed on the protection layer PTL. The second semiconductor pattern SP2 may include an oxide semiconductor. For example, the oxide semiconductor may include an oxide of metal such as zinc (Zn), indium (In), gallium (Ga), tin (Sn), titanium (Ti), or the like, or an oxide of metal mixture such as zinc (Zn), indium (In), gallium (Ga), tin (Sn), titanium (Ti), or the like.

Meanwhile, the second semiconductor pattern SP2 may include a crystallized oxide semiconductor. Grains of the crystallized oxide semiconductor may have a directionality which is vertical with respect to the surface of the oxide semiconductor.

The second semiconductor pattern SP2 may be divided into a first area AR21 and a third area AR23 with both the first and third areas AR11, AR13 including impurities, and a second area AR22 which may be adjacent to the first area AR21 and the third area AR23. The first area AR21, and the third area AR23 may be spaced apart from each other by the second area AR22 in-between. The second area AR22 may be a channel region of the second transistor T2. The second area AR22 may be a passage in which an electron moves or a hole moves depending on a structure of the second semiconductor pattern SP2.

Regarding the second semiconductor pattern SP2, the impurities may include a reduced metal element. For example, the first area AR21 and the third area AR23 may include the metal element reduced from metal oxides forming the second area AR22. Accordingly, the second transistor T2 may have reduced leakage current, and may serve as a switching element with improved on/off properties.

A second insulation layer including a plurality of insulation patterns 21 to 23 may be disposed on the protection layer PTL. The plurality of insulation patterns 21 to 23 may include a first insulation pattern 21, a second insulation pattern 22, and a third insulation pattern 23.

The first insulation pattern 21 may be disposed on the second semiconductor pattern SP2. The first insulation pattern 21 may overlap at least the second area AR22 of the second semiconductor pattern SP2. For example, the first insulation pattern 21 may cover the second area AR22 of the second semiconductor pattern SP2, and may not cover the first area AR21 and the third area AR23 to expose the first area AR21 and the third area AR23.

The second insulation pattern 22 and the third insulation pattern 23 may be respectively disposed on the protection layer PTL. The second insulation pattern 22 and the third insulation pattern 23 may respectively come into contact with the protection layer PTL. Meanwhile, in this exemplary embodiment, the second insulation pattern 22 and the third insulation pattern 23 may be a single pattern connected to each other.

On the first to third insulation patterns 21 to 23, the second control electrode CE2, an upper electrode CE-U, and the second capacitor electrode CPE2 may be disposed. The second control electrode CE2 may be disposed on the first insulation pattern 21. In one example, the second control electrode CE2 may overlap at least the first insulation pattern 21. For example, an edge of the first insulation pattern 21 may be arranged along a corresponding edge of the second control electrode CE2. The second control electrode CE2 may have substantially the same shape as the first insulation pattern 21 on a plane when viewed in the DR3 direction.

The second capacitor electrode CPE2 may be disposed on the third insulation pattern 23 of the capacitor CST. The second capacitor electrode CPE2 may overlap at least the third insulation pattern 23. The second capacitor electrode CPE2 may come in contact with the third insulation pattern 23.

The second capacitor electrode CPE2 may define another electrode of the capacitor CST. Between the first capacitor electrode CPE1 and the second capacitor electrode CPE2, the protection layer PTL and the third insulation pattern 23 may be disposed. The capacitor, according to an exemplary embodiment of the present inventive concept, may define an electric field in the third insulation pattern 23 and the protection layer PTL by means of a potential difference applied between the first capacitor electrode CPE1 and the second capacitor electrode CPE2.

The upper electrode CE-U may be disposed on the second insulation pattern 22. The upper electrode CE-U may be disposed on substantially the same layer as the second capacitor electrode CPE2. For example, both the upper electrode CE-U and the second capacitor electrode CPE2 may be respectively formed on the second insulation pattern 22 and the third insulation pattern 23. As shown in FIG. 2, the upper electrode CE-U may overlap at least the second insulation pattern 22. An edge of the second insulation pattern 22 may be arranged along a corresponding edge of the upper electrode CE-U. The upper electrode CE-U may have substantially the same shape as the second insulation pattern 22 on a plane when viewed in the DR3 direction.

The upper electrode CE-U may receive a different electric signal than the first control electrode CE1. The upper electrode CE-U, according to an exemplary embodiment of the present inventive concept, may be electrically connected to the second capacitor electrode CPE2. In another exemplary embodiment, the upper electrode CE-U and the second capacitor electrode CPE2 may be a conductive pattern having an integral shape.

A third insulation layer 30 may be disposed on the second control electrode CE2, the upper electrode CE-U, and the second capacitor electrode CPE2. The third insulation layer 30 may be disposed on the protection layer PTL and may cover the second control electrode CE2, the upper electrode CE-U, and the second capacitor electrode CPE2, as shown in FIG. 2. The third insulation layer 30 may cover an upper surface and a side surface of the second control electrode CE2, an upper surface and a side surface of the second capacitor electrode CPE2, an upper surface and a side surface of the upper electrode CE-U, and each side surface of the first to third insulation patterns 21 to 23. The third insulation layer 30 may include an organic material and/or an inorganic material.

The third insulation layer 30 may be thicker than the protection layer PTL. In one example, as shown in FIG. 2, the third insulation layer 30 may be formed to provide a flat surface above the second control electrode CE2, the upper electrode CE-U, and the second capacitor electrode CPE2. Accordingly, one or more elements disposed above the second control electrode CE2, the upper electrode CE-U, and the second capacitor electrode CPE2 may be disposed on the flat surface of the third insulation layer 30.

On the third insulation layer 30, the first input electrode IE1, the first output electrode OE1, the second input electrode IE2, and the second output electrode OE2 may be disposed. The first input electrode IE1, the first output electrode OE1, the second input electrode IE2, and the second output electrode OE2 may respectively overlap the first area AR11 and the third area AR13 of the first semiconductor pattern SP1, and the first area AR21 and the third area AR23 of the second semiconductor pattern SP2 on a plane when viewed in the DR3 direction. The first input electrode IE1, the first output electrode OE1, the second input electrode IE2, and the second output electrode OE2 may penetrate to be connected to the first semiconductor pattern SP1 or the second semiconductor pattern SP2. For example, the first input electrode IE1 and the first output electrode OE1 may respectively penetrate at least a portion of the first insulation layer 10, the protection layer PTL, and the third insulation layer 30 to be connected to the first semiconductor pattern SP1, and the second input electrode IE2 and the second output electrode OE2 may respectively penetrate at least the third insulation layer 30 to be connected to the second semiconductor pattern SP2.

In this example, the first input electrode IE1 and the first output electrode OE1 may be respectively connected to the first area AR11, and the third area AR13 of the first semiconductor pattern SP1 through first penetration portions OP1, where the first penetration portions OP1 may penetrate the first insulation layer 10, the protection layer PTL, and the third insulation layer 30. The second input electrode IE2 and the second output electrode OE2 may be respectively connected to the first area AR21, and the third area AR23 of the second semiconductor pattern SP2 through second penetration portions OP2, which may penetrate the third insulation layer 30.

An intermediate film ILD may be disposed on the third insulation layer 30. The intermediate film ILD may include an inorganic material and/or an organic material. On the intermediate film ILD, a third penetration portion OP3 penetrating the intermediate film ILD may be defined. The third penetration portion OP3 may be defined in a portion overlapping the first output electrode OE1, as shown in FIG. 2.

The first electrode ED1 may be disposed on the intermediate film ILD. The first electrode ED1 may be connected to the first output electrode OE1 of the first transistor T1 through the third penetration portion OP3. The first electrode ED1 may include a conductive material. The first electrode ED1 may be a reflective, or a transmissive electrode, but not limited thereto.

A pixel definition film PLD may be disposed on the intermediate film ILD. The pixel definition film PLD may include an organic film and/or an inorganic film. On the pixel definition film PLD, a predetermined opening portion OP-PX may be defined. The opening portion OP-PX may expose at least a portion of the first electrode ED1.

On the first electrode ED1, the first charge control layer HCL, the light emitting layer EML, the second charge control layer ECL, and the second electrode ED2 may be sequentially laminated. The first electrode ED1, the first charge control layer HCL, the light emitting layer EML, the second charge control layer ECL, and the second electrode ED2 may constitute the organic light emitting diode OLED.

The first charge control layer HCL may include a hole injection/transport material, and the second charge control layer ECL may include an electron injection/transport material. Alternately, the first charge control layer HCL may include an electron injection/transport material, and the second charge control layer ECL may include a hole injection/transport material. The first charge control layer HCL and the second charge control layer ECL may respectively include one or more layers.

The light emitting layer EML may include a light emitting material. The light emitting layer EML may be a light emitting pattern overlapping the opening portion OP-PX. The light emitting layer EML may include one or more layers. Meanwhile, although not shown, a plurality of the light emitting layer EML may be provided and disposed to form a multilayered structure.

The second electrode ED2 may be disposed on the second charge control layer ECL. The second electrode ED2 may overlap at least the first electrode ED1. In this exemplary embodiment, the second electrode ED2 may overlap substantially the pixel definition layer PDL entirely.

The second electrode ED2 may include a conductive material. The second electrode may be a transmissive electrode or a reflective electrode. The organic light emitting diode OLED may generate light from the light emitting layer EML using a voltage difference applied between the first electrode ED1 and the second electrode ED2.

In another exemplary embodiment, although not shown, the organic light emitting diode OLED may further includes at least one charge generation layer disposed between the first electrode ED1 and the second electrode ED2.

In another exemplary embodiment, although not shown, the semiconductor device SD1 may further include an organic film and/or an inorganic film disposed on the second electrode ED2.

The semiconductor device SD1, according to an exemplary embodiment of the present inventive concept, may protect the first insulation layer 10 from subsequent process by further including the protection layer PTL. Accordingly, the first insulation layer 10 may be stably maintained during the subsequent process, and a short circuit or a leakage current due to the damage of the first insulation layer 10 may be prevented. A detailed explanation thereof will be described later.

Figure 3:
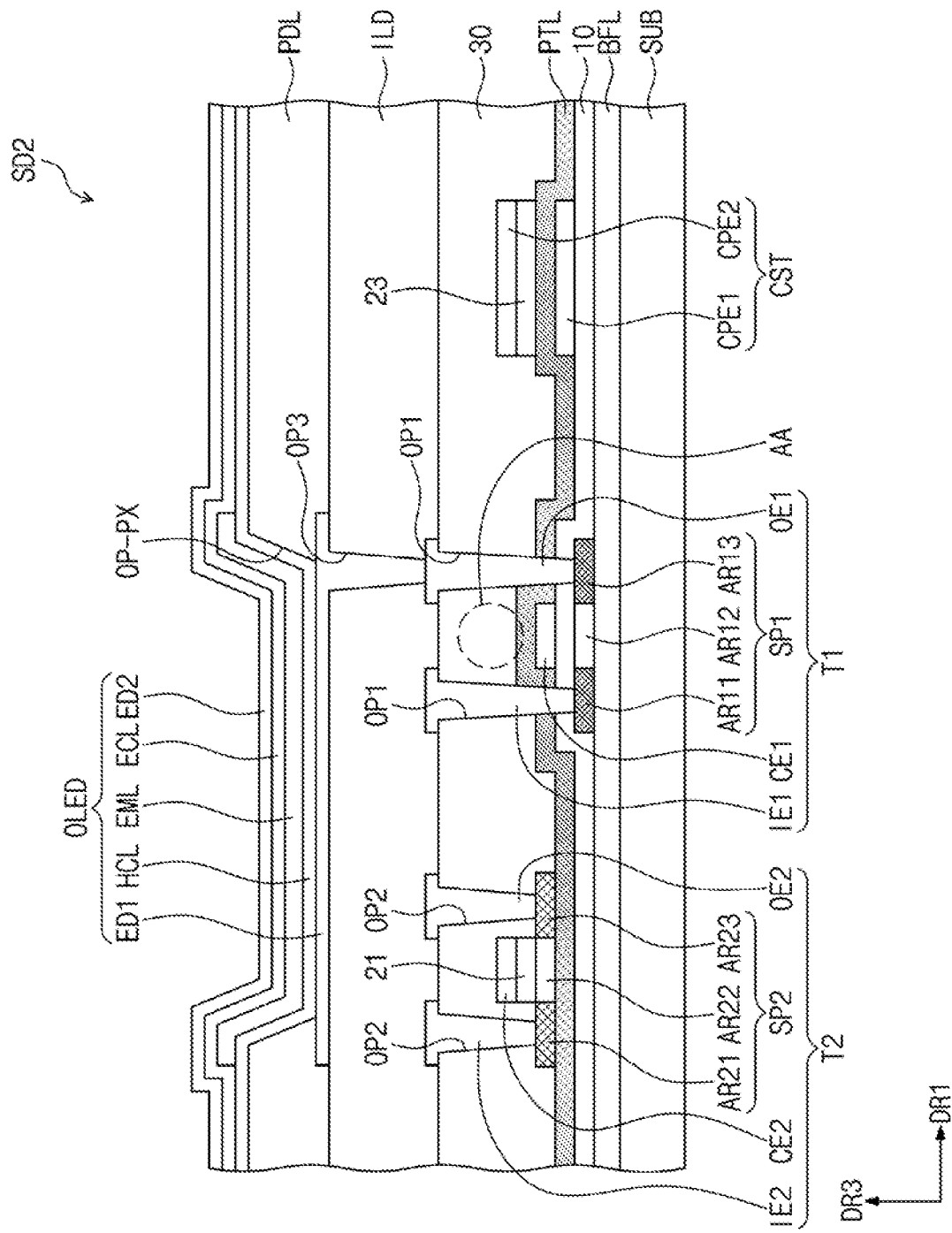
FIG. 3 is a cross-sectional view showing a portion of a semiconductor device according to an exemplary embodiment of the present inventive concept.

FIG. 3 is a cross-sectional view showing a portion of a semiconductor device according to an exemplary embodiment of the present inventive concept. In FIG. 3, a semiconductor device SD2 will be described. Meanwhile, it is noted that the same elements as the elements described in FIG. 1 and FIG. 2 may be assigned the same reference numerals, and duplicate descriptions will be omitted.

As shown in FIG. 3, the semiconductor device SD2 may include the first transistor T1, the second transistor T2, the capacitor CST, and the organic light emitting diode OLED. In this example, the semiconductor device SD2 may omit the second insulation pattern 22 and an upper electrode CE-U, which were previously shown in FIG. 2. Accordingly, an AA region above the first control electrode CE1 may not include an insulation layer, and the semiconductor device SD2 may include the first insulation pattern 21, and the third insulation pattern 23, as shown in FIG. 3.

As shown in FIG. 3, the semiconductor device SD2, according to an exemplary embodiment of the present inventive concept, does not include a separate conductive pattern overlapping the first control CE1, and the first transistor T1 may be operated with ease by having a single first control electrode CE1.

Figure 4A:
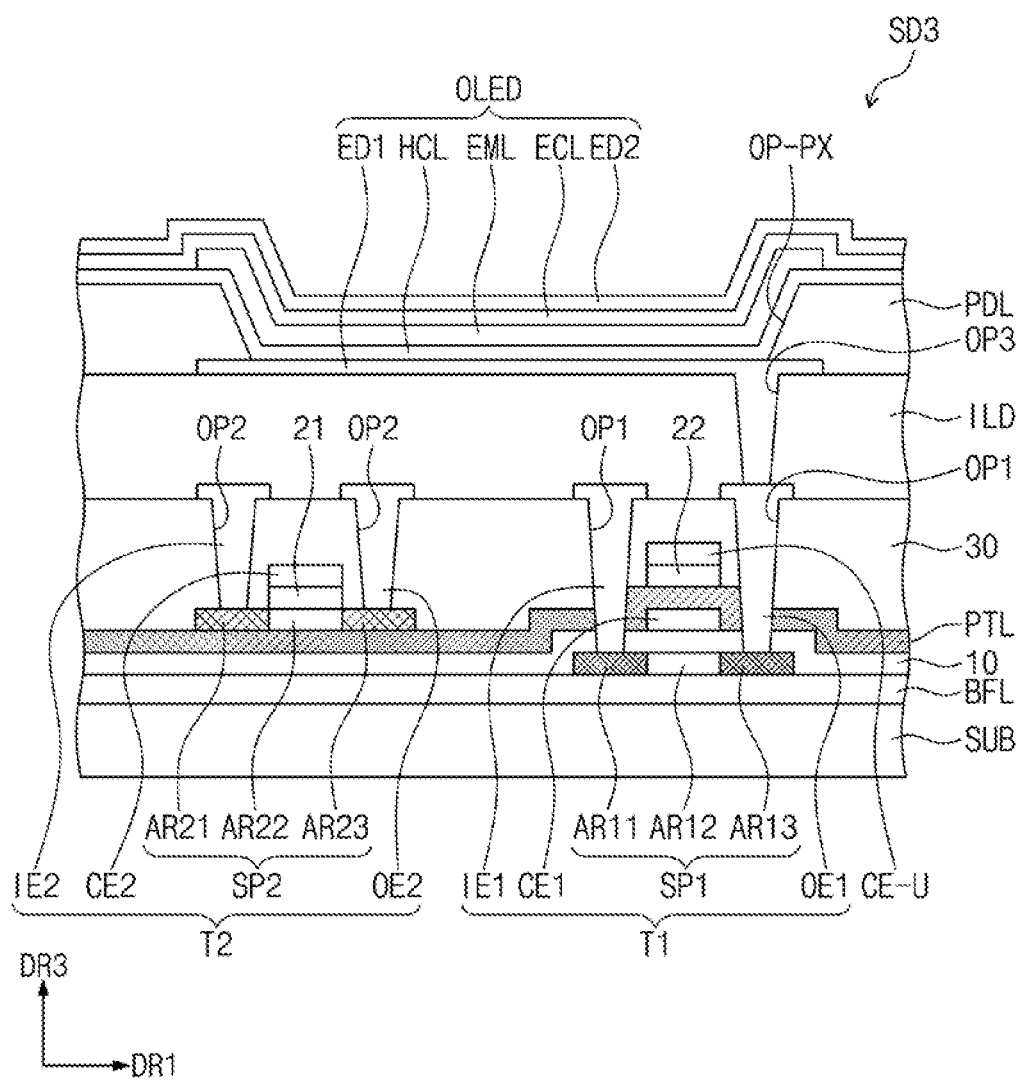
FIG. 4A is a cross-sectional view showing a portion of a semiconductor device according to an exemplary embodiment of the present inventive concept.
Figure 4B:
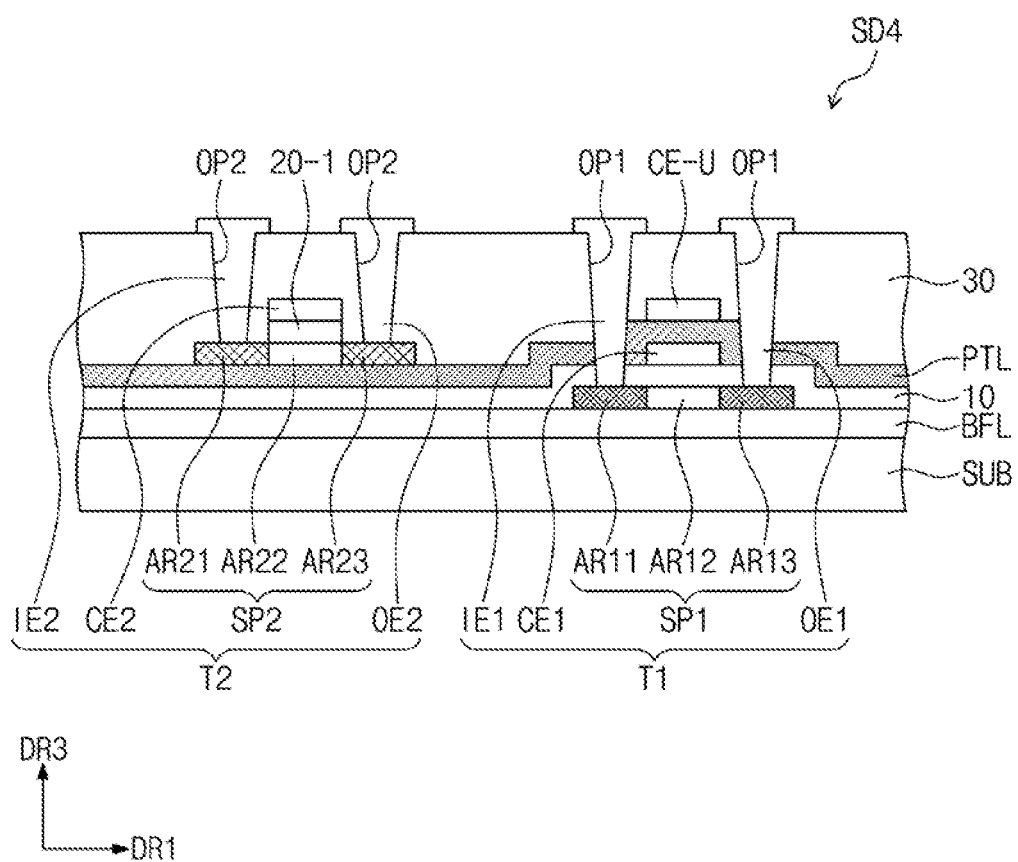
FIG. 4B is a cross-sectional view showing a portion of a semiconductor device according to an exemplary embodiment of the present inventive concept.

FIG. 4A is a cross-sectional view showing a portion of a semiconductor device according to an exemplary embodiment of the present inventive concept. FIG. 4B is a cross-sectional view showing a portion of a semiconductor device according to an exemplary embodiment of the present inventive concept. Semiconductor devices SD3 and SD4 will be described in view of FIG. 4A and FIG. 4B. Meanwhile, it is noted that the elements in FIGS. 4A and 4B, which are same as the elements described in FIG. 2 to FIG. 3 may be assigned the same reference numerals, and duplicate descriptions will be omitted.

As shown in FIG. 4A and FIG. 4B, the semiconductor devices SD3 and SD4 may respectively include the first transistor T1 and the second transistor T2. The first transistor T1 and the second transistor T2 may respectively correspond to the first transistor T1 and the second transistor T2 illustrated in FIG. 2.

A capacitor may be defined on the first semiconductor pattern SP1. The capacitor may be defined by the first control electrode CE1 and the upper electrode CE-U. Accordingly, the first control electrode CE1 may become an element of the first transistor T1 and the capacitor at the same time.

Meanwhile, the capacitor may have various capacitances according to a dielectric layer disposed between the first control electrode CE1 and the upper electrode CE-U. In another example, capacitances may also vary depending on a location in which the upper electrode CE-U is disposed.

For example, as shown in FIG. 4A, the upper electrode CE-U may be disposed on the second insulation pattern 22 and the protection layer PTL. Accordingly, a capacitance of a capacitor, which is defined by the first control electrode CE1 and the upper electrode CE-U, may be influenced by both the second insulation pattern 22 and the protection layer PTL. For example, the capacitor may be influenced by the thickness and a material of the second insulation pattern 22 and the protection layer PTL, respectively. In this exemplary embodiment, the second insulation pattern 22 may correspond to the second insulation layer 22 as illustrated in FIG. 2.

Also, for example, as shown in FIG. 4B, the upper electrode CE-U may be disposed on the first control electrode CE1 with only the protection layer PTL in-between. In this exemplary embodiment, the semiconductor device SD4 may include a second insulation layer 20-1 having a different shape than that of the semiconductor device SD3 of FIG. 4A. For example, the second insulation layer 20-1 of FIG. 4B may have a different shape than the second insulation layer 21 of FIG. 4A.

In this exemplary embodiment, the second insulation layer 20-1 may be disposed between the second semiconductor pattern SP2 and the second control electrode CE2. The second insulation layer 20-1 may be a single insulation pattern overlapping the second area AR22 of the second semiconductor pattern SP2. When viewed in the direction of DR3, the second insulation layer 20-1, on a plane, may not cover the first area AR11 and the third area AR13, to expose the first area AR11 and the third area AR13 of the second semiconductor pattern SP2, and may cover a second area AR12. The boundary between the first area AR21 and the second area AR22, and the boundary between the second area AR22 and the third area AR23 may be arranged along a side surface of the second insulation layer 20-1.

Meanwhile, in this exemplary embodiment, the upper electrode CE-U may be disposed on the first control electrode CE1, and may form an electric field with the first control electrode CE1. Accordingly, the upper electrode CE-U may become one electrode constituting the capacitor, and the first control electrode CE1 may become the other electrode constituting the capacitor.

In this exemplary embodiment, the upper electrode CE-U may directly be disposed on the protection layer PTL. The protection layer PTL may be disposed between the upper electrode layer CE-U and the first control electrode CE1 and may serve as a dielectric layer of a capacitor defined by the upper electrode CE-U and the first control electrode CE1. Accordingly, the capacitor defined by the upper electrode CE-U and the first control electrode CE1 may be influenced by the thickness of the protection layer PTL and a material constituting the protection layer PTL.

The semiconductor device SD4 according to an exemplary embodiment of the present inventive concept may include a capacitor using the single protection layer PTL as a dielectric layer such that the capacitance of the capacitor may be controlled by controlling physical properties, such as the thickness or material, of the protection layer PTL only.

FIGS. 5A through 5M are cross-sectional views showing a method of manufacturing a semiconductor device according to exemplary embodiments of the present inventive concept. FIGS. SA through 5M illustrate a method of manufacturing the semiconductor device SD1 in FIG. 2 by way of an example, which will be described hereafter.

As shown in FIG. 5A, the buffer layer BFL and a pre first semiconductor pattern SP1-A may be provided on the base substrate SUB. The buffer layer BFL may be provided by depositing, coating, or printing an inorganic material and/or an organic material on the base substrate SUB. Meanwhile, the semiconductor device SD1, according to an exemplary embodiment of the present inventive concept, may operate without the buffer layer BFL.

In one example, the pre first semiconductor pattern SP I-A may be provided on the base substrate SUB or the buffer layer BFL. The pre first semiconductor pattern SP1-A may be provided by depositing a crystalline semiconductor material followed by patterning the deposited crystalline semiconductor material.

Hereafter, as shown in FIG. 5B, a pre first insulation layer 10-A and a conductive layer CL may be provided. The pre first insulation layer 10-A may be provided by depositing, coating, or printing an inorganic material and/or an organic material on the base substrate SUB or the buffer layer BFL. The pre first insulation layer 10-A may cover the pre first semiconductor pattern SP1-A. In one example, the conductive layer CL may be formed by depositing a conductive material on the pre first insulation layer 10-A.

After a first conductive pattern may be formed from the conductive layer CL, as shown in FIG. 5C, the first semiconductor pattern SP1 may be formed. The first conductive pattern may be formed on the pre first insulation layer 10-A. The first conductive pattern may include the first control electrode CE1 and the first capacitor electrode CPE1.

For example, the first control electrode CE1 and the first capacitor electrode CPE1 may be formed by patterning the conductive layer CL. The first control electrode CE1 and the first capacitor electrode CPE1 may be simultaneously patterned using the same mask. Meanwhile, in another example, the first control electrode CE1 and the first capacitor electrode CPE1 may respectively be patterned using different masks.

The first semiconductor pattern SP1 may be formed by implanting impurities DM to the pre first semiconductor pattern SP1-A. The impurities DM, for example, may be implanted into the pre first semiconductor pattern SP1-A by a diffusion process, or an ion implanting process, but not limited to a specific method.

The impurities DM may include various materials. For example, the impurities DM may include a trivalent element. In this example, the first semiconductor pattern SP1 may be provided as a p-type semiconductor. In another example, the impurities DM may include a pentavalent element. In this example, the first semiconductor pattern SP1 may be provided as an n-type semiconductor.

The impurities DM may be implanted into a portion of the pre first semiconductor pattern SP1-A. For example, the impurities DM may be planted into a portion that does not overlap the first control electrode CE1, and the pre first semiconductor pattern SP1-A (as shown in FIG. 5B) may be changed to the first semiconductor pattern SP1 which is divided into the first area AR11, the second area AR12, and the third area AR13. In this example, the first area AR11 and the third area AR13 may be provided with the impurities DM by a diffusion process, or an ion implantation process etc. Accordingly, the impurities DM may be included in the first area AR11 and the third area AR13 of the first semiconductor pattern SP1.

As shown in FIG. 5D, an pre protection layer PTL-A and an pre second semiconductor pattern SP2-A may be formed. The pre protection layer PTL-A may be formed by depositing, coating, or printing an organic material and/or an inorganic material on the pre first insulation layer 10-A. The pre protection layer PTL-A may be provided to substantially entirely cover the first control electrode CE1 and the first capacitor electrode CPE1.

An pre second semiconductor pattern SP2-A is formed. The pre second semiconductor pattern SP2-A may be formed by forming a material layer including an oxide semiconductor on the pre protection layer PTL-A and then by patterning the firmed oxide semiconductor. The oxide semiconductor, as described above, may include an oxide of metal such as zinc (Zn), indium (In), gallium (Ga), tin (Sn), titanium (Ti), or the like, or an oxide of metal mixture such as zinc (Zn), indium (In), gallium (Ga), tin (Sn), titanium (Ti), or the like.

As shown in FIG. 5E, an pre second insulation layer 20-A, the second control electrode CE2, the upper electrode CE-U, and the second capacitor electrode CPE2 may be formed on the pre protection layer PTL-A. The pre second insulation layer 20-A may be formed by deposition, coating, or printing an organic material and/or an inorganic material on the pre protection layer PTL-A.

A second conductive pattern including the second control electrode CE2 and the second capacitor electrode CPE2 may be formed on the pre second insulation layer 20-A. The second control electrode CE2 and the second capacitor electrode CPE2 may be formed by depositing a conductive material on the pre second insulation layer 20-A and then by patterning the deposited conductive material. The second control electrode CE2 and the second capacitor electrode CPE2 may be simultaneously patterned using one mask. Accordingly, processing cost may be reduced and processing time may be shortened.

Meanwhile, the second conductive pattern may further include an upper electrode CE-U. The upper electrode CE-U may be formed to overlap the first control electrode CE1 on a plane when viewed in the DR3 direction. For example, the upper electrode CE-U may be simultaneously patterned with the second control electrode CE2 and the second capacitor electrode CPE2 using one mask. In this example, the upper electrode CE-U may be formed to be connected to the second capacitor electrode CPE2 to have an integral shape.

As shown in FIG. 5F, the first insulation pattern 21, the second insulation pattern 22, and the third insulation pattern 23 may be formed. The first insulation pattern 21, the second insulation pattern 22, and the third insulation pattern 23 may be formed by patterning the pre second insulation layer 20-A using, for example, an etching gas ET.

In this example, the first insulation pattern 21, the second insulation pattern 22, and the third insulation pattern 23 may be respectively patterned using the first control electrode CE1, the upper electrode CE-U, and the second capacitor electrode CPE2 as masks. End portions of the first insulation pattern 21, the second insulation pattern 22, and the third insulation pattern 23 may be respectively arranged along end portions of the first control electrode CE1, the upper electrode CE-U, and the second capacitor electrode CPE2.

Meanwhile, the etch rate for the pre protection layer PTL-A may be lower than that of the pre second insulation layer 20-A with respect to the etching gas ET. For example, the pre protection layer PTL-A may include a material such that a etch selectivity for the pre second insulation layer 20-A may be higher than that of the pre protection layer PTL-A with respect to the etching gas ET. Herein a high etch selectivity may be equivalent to a high etch rate, and a low etch selectivity may be equivalent to a low etch rate. For example, in the case that the pre second insulation layer 20-A includes a silicon oxide, the pre protection layer PTL-A may include an aluminum oxide, where the etch rate for the silicon oxide may be greater than the etch rate for the aluminum oxide.

For example, the etching rate of the pre protection layer PTL-A with respect to the etching gas ET may be less than the etching rate of the pre second insulation layer 20-A with respect to the etching gas ET. Therefore, the pre protection layer PTL-A may not be etched while the pre second insulation layer 20-A is being etched by the etching gas ET. Even in the case that the pre second insulation layer 20-A has been excessively etched during the extended etching processing time, the pre first insulation layer 10-A disposed under the pre protection layer PTL-A may be protected by the pre protection layer PTL-A without being affected by the etching gas ET.

For example, in a method of manufacturing a semiconductor device according to an exemplary embodiment of the present inventive concept, even if the first insulation layer 10-A disposed under the pre protection layer PTL-A includes substantially the same material as the pre second insulation layer 20-A, or includes a material having higher etch rate than the pre second insulation layer 20-A with respect to the etching gas ET, the initial insulation layer 10-A may be protected by the pre protection layer PTL-A during the subsequent process in which the first insulation pattern 21, the second insulation pattern 22, and the third insulation pattern 23 may be formed. Accordingly, the first insulation layer 10-A may be formed of various materials having no limitation in constituting materials. For example, the first insulation layer 10-A may be formed of either a material with a substantially high etch rate or a material with a substantially low etch rate, with respect to the etching gas ET.

Figure 5G:
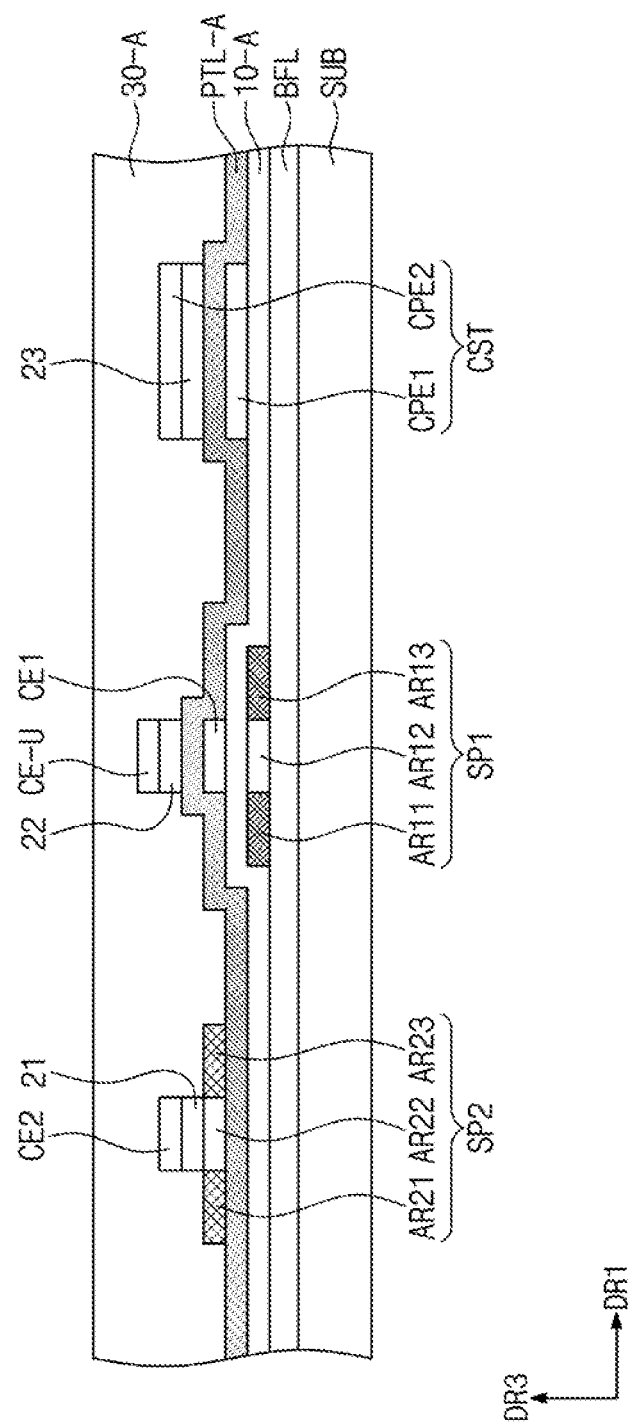

FIG. 5G illustrates that an initial third insulation layer 30-A may be formed. The initial third insulation layer 30-A may be formed by deposition, coating, or printing an inorganic material and/or an organic material on the pre protection layer PTL-A. The initial third insulation layer 30-A may cover the second control electrode CE2, the upper electrode CE-U, and the second capacitor electrode CPE2, and may be formed to be thick enough to have a flat surface provided on an upper side thereof.

Meanwhile, at least a portion of the second semiconductor pattern SP2-A may include selectively reduced metal element. For example, at least a portion of the pre second semiconductor pattern SP2-A may be blocked by the first insulation pattern 21 to form the second area AR22, and at least a portion of the pre second semiconductor pattern SP2-A may be exposed from the first insulation pattern 21, to form the first area AR21 and the third area AR23. The second semiconductor pattern SP2 may be divided into the first area AR21, the second area AR22, and the third area AR23. The exposed first area AR21 and third area AR23 may include a metal element reduced from a metal oxide while the second area AR22 may include the metal oxide.

Figure 5H:
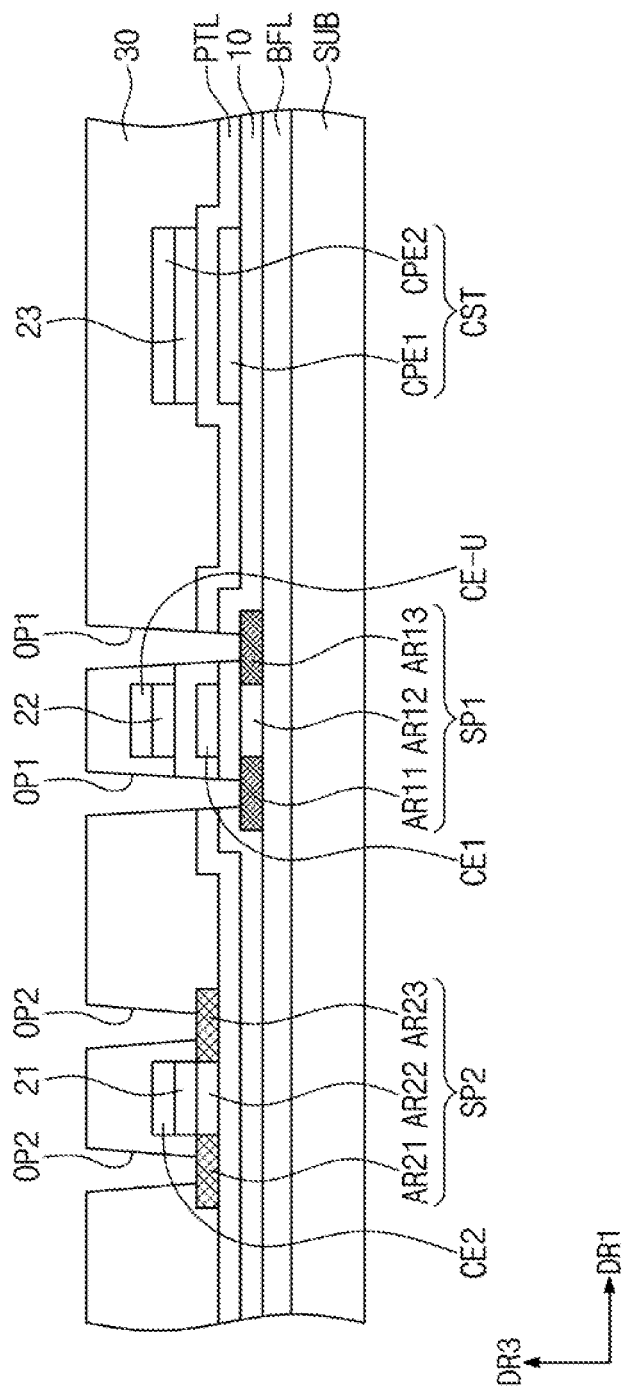

FIG. 5H illustrates that first penetration portions OP1 and second penetration portions OP2 may be formed to form the first insulation layer 10, the protection layer PTL, and the third insulation layer 30. For example, the first penetration portions OP1 may be provided by respectively penetrating the pre first insulation layer 10-A, the pre protection layer PTL-A, and the initial third insulation layer 30-A. The first penetration portions OP1 may be respectively defined in the first area AR11 and the third area AR13 of the first semiconductor pattern SP1 and expose at least a portion of the first area AR11, and at least a portion of the third area AR13.

The second penetration portions OP2 may be provided by respectively penetrating the initial third insulation layer 30-A. The second penetration portions OP2 may be respectively defined in the first area AR21 and the third area AR23 of the second semiconductor pattern SP2 and expose at least a portion of the first area AR21 and at least a portion of the third area AR23.

Figure 5I:
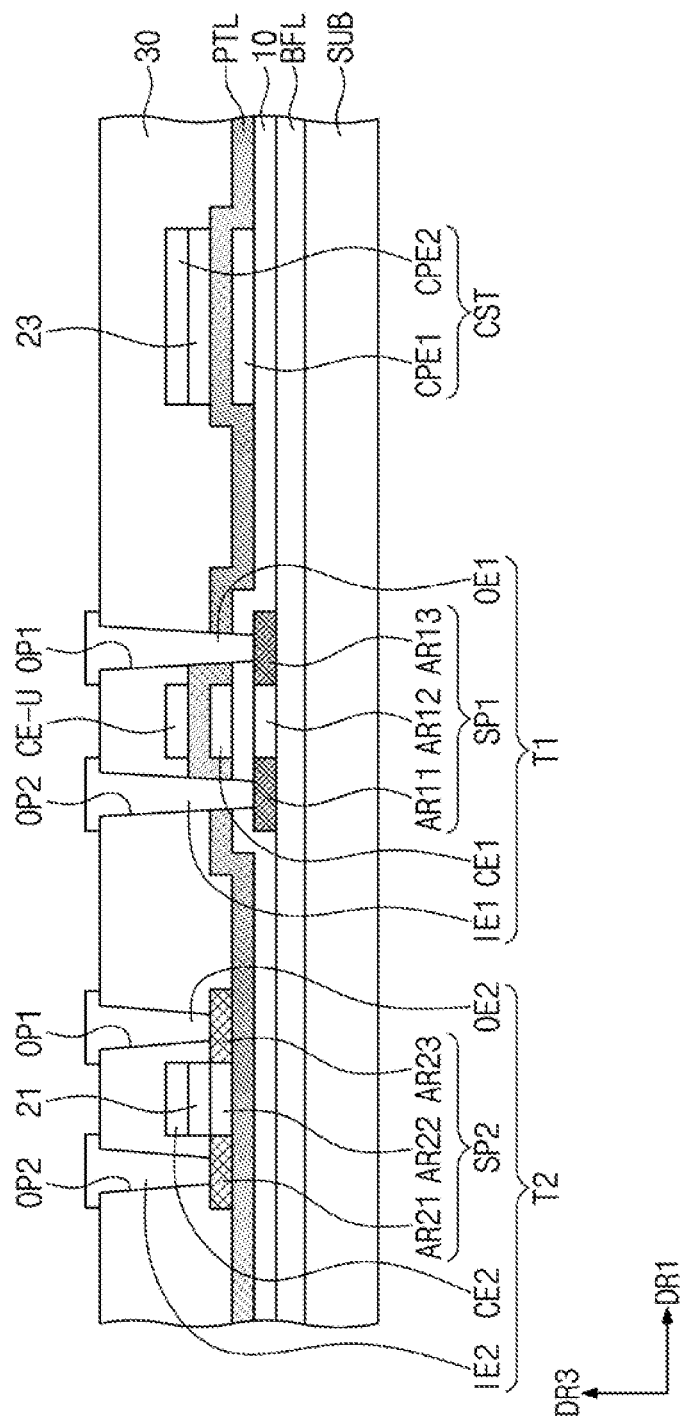

Hereafter, as shown in FIG. 5I, the first input electrode IE1, the first output electrode OE1, the second input electrode IE2, and the second output electrode OE2 may be formed. The first input electrode IE1, the first output electrode OE1, the second input electrode IE2, and the second output electrode OE2 may be formed by forming a layer including a conductive material on the third insulation layer 30 and then by patterning the layer.

For example, the first input electrode IE1, the first output electrode OE1, the second input electrode IE2, and the second output electrode OE2 may fill the first penetration portions OP1 and the second penetration portions OP2, respectively. The first input electrode IE1 and the first output electrode OE1 may be respectively connected to the first area AR11 of the first semiconductor pattern SP and the third area AR13 of the first semiconductor pattern SP1 through the first penetration portions OP1, and may constitute the first transistor T1. The second input electrode IE2 and the second output electrode OE2 may be respectively connected to the first area AR21 of the second semiconductor pattern SP2 and the third area AR23 of the second semiconductor pattern SP2, and may constitute the second transistor T2.

Figure 5J:
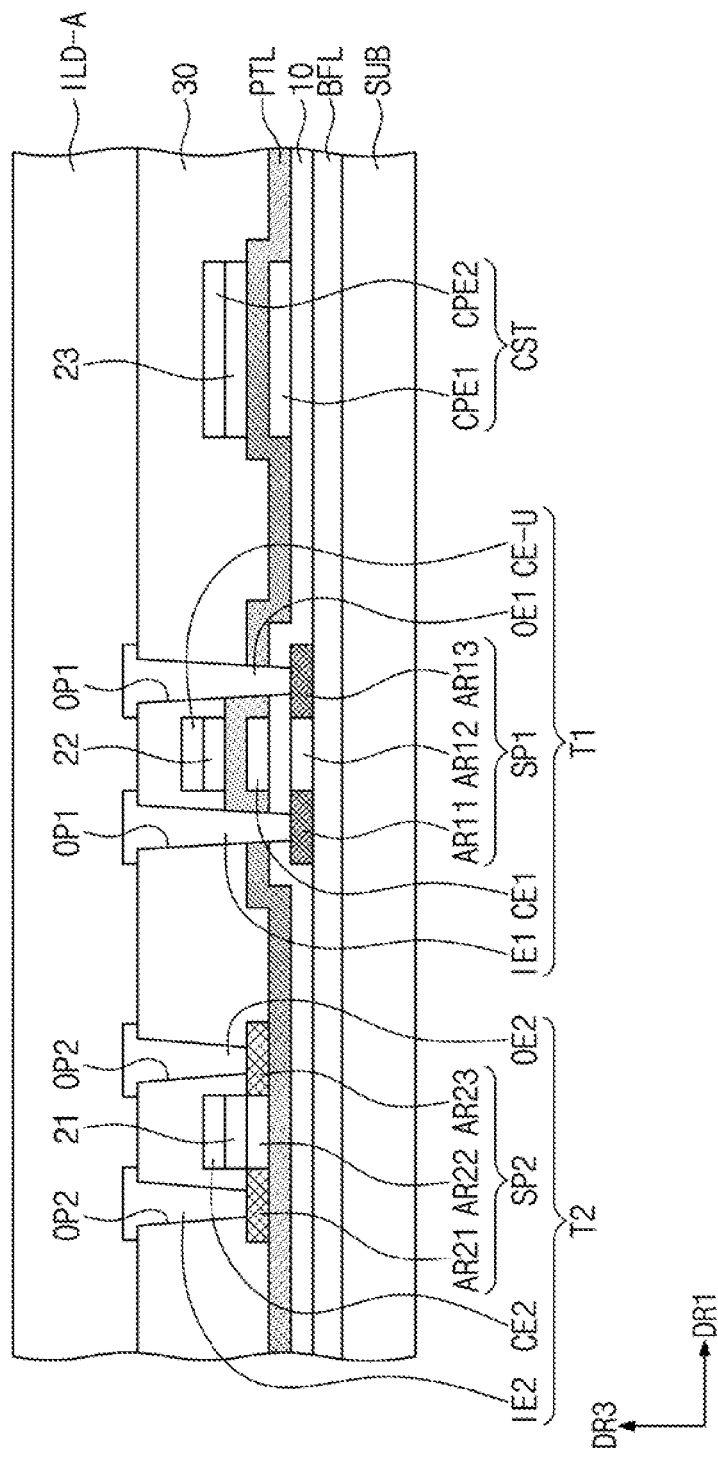

Hereafter, as shown in FIG. 5J, an initial intermediate film ILD-A may be formed on the third insulation layer 30. The initial intermediate film ILD-A may be formed by deposition, coating, or printing an inorganic material and/or an organic material on the third insulation layer 30.

Figure 5K:
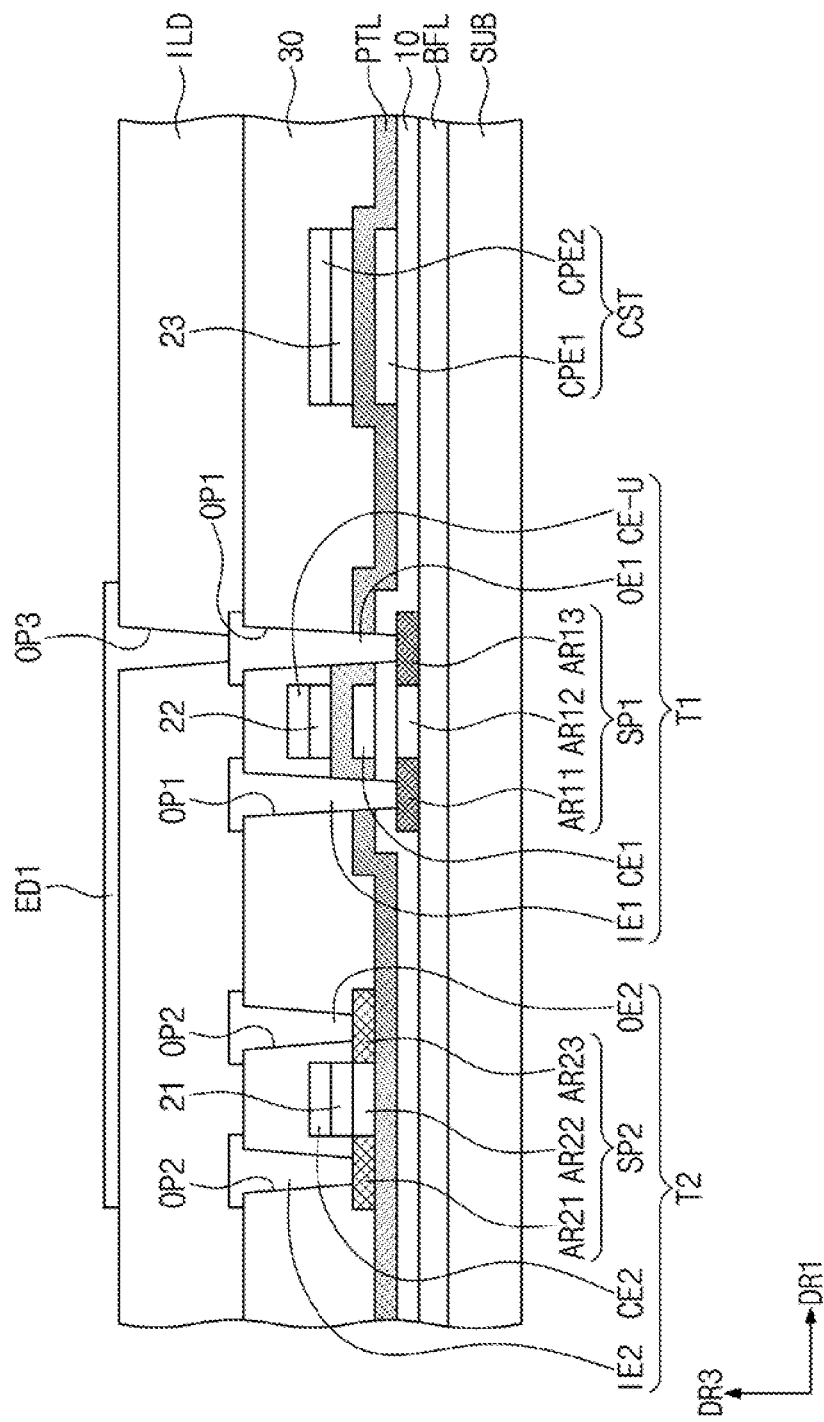

Hereafter, as shown in FIG. 5K, an intermediate film ILD and a lower electrode ED1 may be formed. The intermediate film ILD may be formed by defining a third penetration portion OP3 configured to penetrate the initial intermediate film ILD-A. In one example, the third penetration portion OP3 may be provided until the third penetration portion OP3 reaches the first output electrode OE1 to overlap the first output electrode OE1.

The lower electrode ED1 may be formed by forming a conductive material on the intermediate film ILD and then by patterning the formed conductive material. The lower electrode ED1 may be connected to the first output electrode OE1 through the third penetration portion OP3.

Figure 5L:
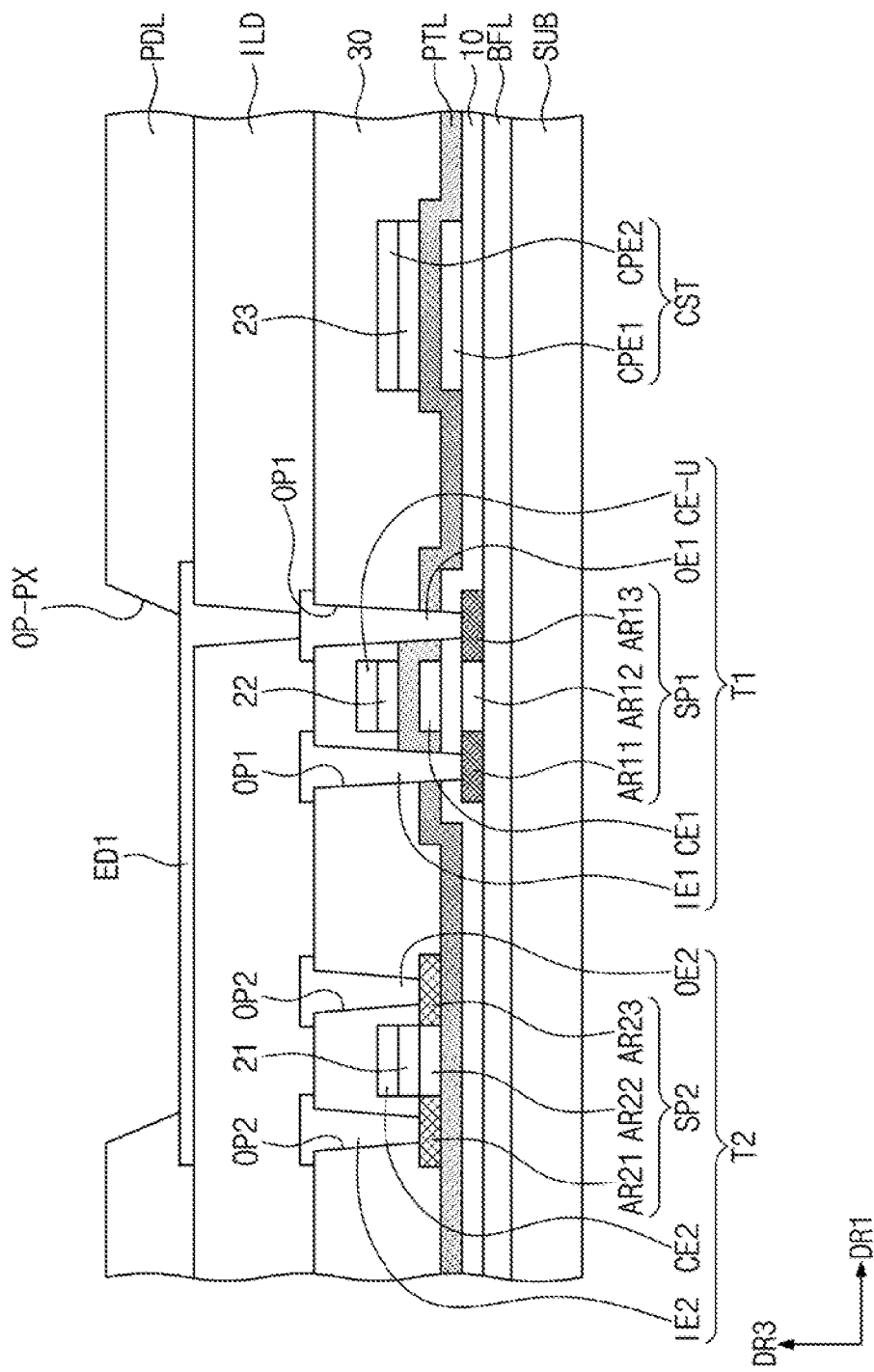

Hereafter, as shown in FIG. 5L, a pixel definition film PDL may be formed on the intermediate film ILD. The pixel definition film PDL may be formed by deposition, coating, or printing an organic material and/or an inorganic material on the intermediate film ILD, and then by defining a predetermined opening portion OP-PX. The opening portion OP-PX may expose at least a portion of the lower electrode ED1.

Figure 5M:
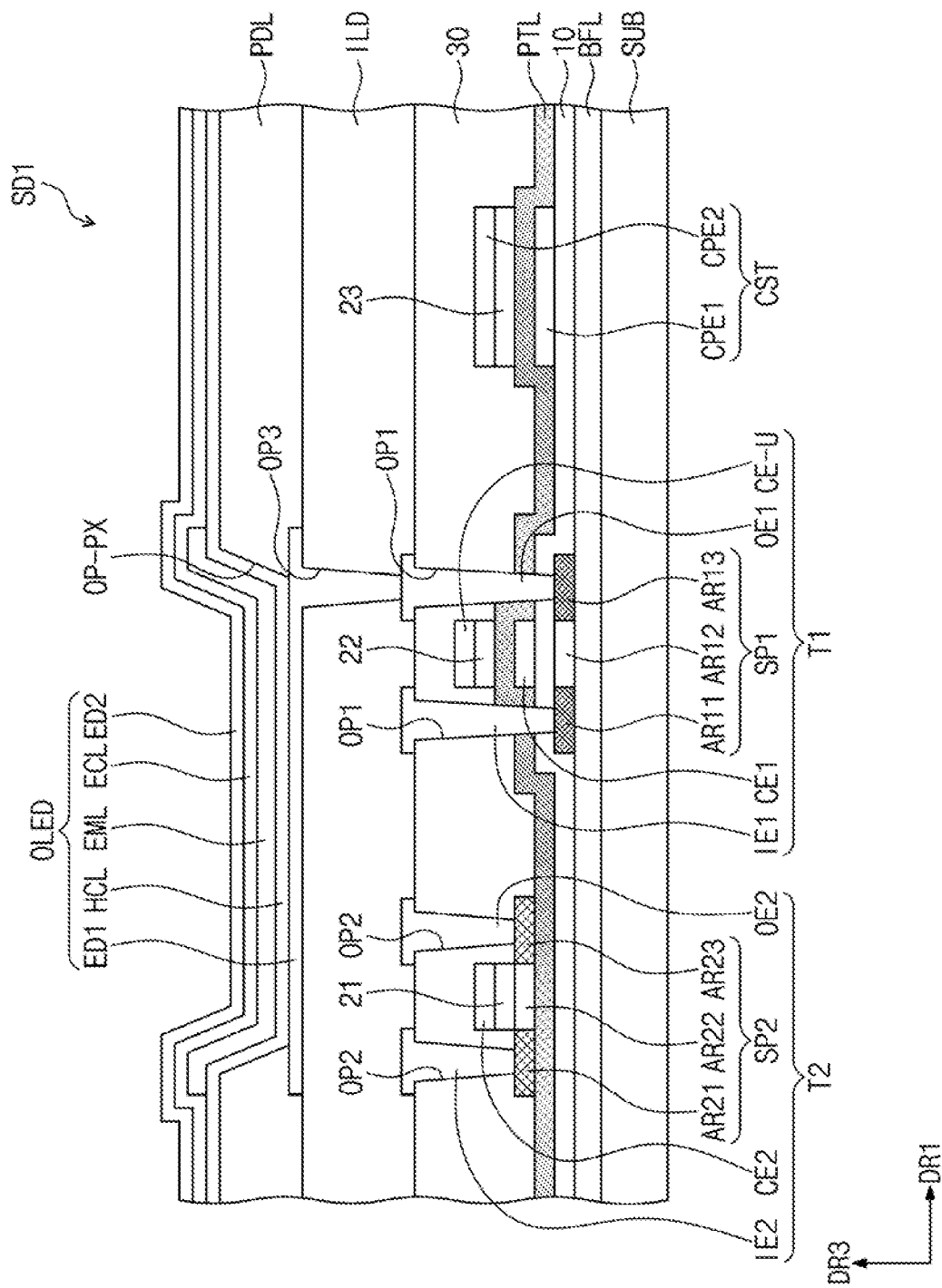

FIG. 5M illustrates forming an organic light emitting diode OLED. As shown in FIG. 5M, a first charge control layer HCL, a light emitting layer EML, a second charge control layer ECL, and a second electrode ED2 may be sequentially formed on the pixel definition film PDL. The first electrode ED1, the first charge control layer HCL, the light emitting layer EML, the second charge control layer ECL, and the second electrode ED2 may constitute the organic light emitting diode OLED. Meanwhile, the first charge control layer HCL, the light emitting layer EML, and the second charge control layer ECL may be respectively formed by a single process, or by multiple processes.

As described above, according to an exemplary embodiment of the present inventive concept, stability of the first insulation layer 10 may be improved due to the protection layer PTL or the pre protection layer PTL-A that is formed on the first insulation layer 10. Accordingly, a semiconductor device with improved reliability may be provided.

Figure 6A:
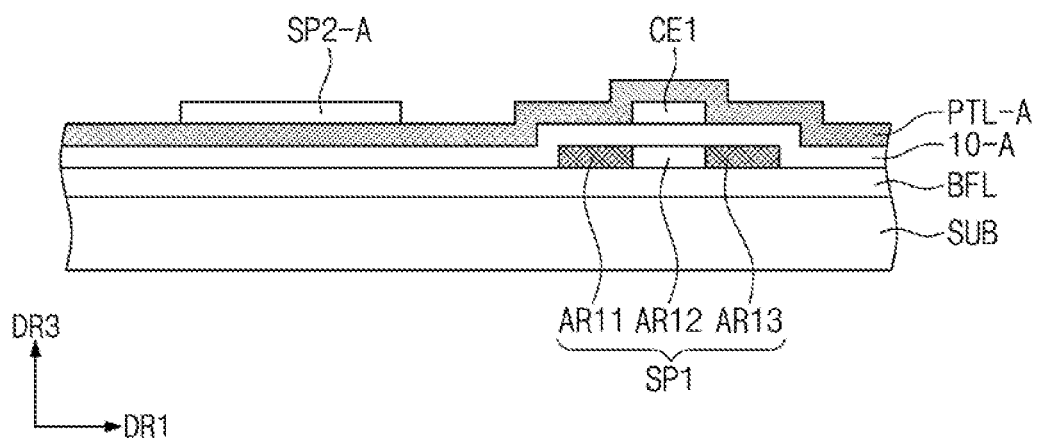
FIGS. 6A through 6G are cross-sectional views showing a method of manufacturing a semiconductor device according to exemplary embodiments of the present inventive concept.

FIGS. 6A through 6G are cross-sectional views showing a method of manufacturing a semiconductor device according to an exemplary embodiment of the present inventive concept. In FIGS. 6A through 60, the semiconductor device SD3 (as shown in FIG. 4) may be illustrated. Hereafter, referring to FIG. 6A through FIG. 6G, a method of manufacturing the semiconductor device SD3 will be described. It is noted that the same elements in FIG. 6A through FIG. 6G as the elements described in FIG. 4 may be assigned the same reference numerals.

As shown in FIG. 6A, a buffer layer BFL may be formed on the base substrate SUB, and then the first semiconductor pattern SP1, the initial insulation layer 10-A, the first control electrode CE1, the pre protection layer PTL-A, and the pre second semiconductor pattern SP2-A may be formed. Detailed explanation of forming the first semiconductor pattern SP1, the initial insulation layer 10-A, the first control electrode CE1, the pre protection layer PTL-A, and the pre second semiconductor pattern SP2-A may be substantially similar to the forming method described for FIG. 5A through FIG. 5D.

Figure 6B:
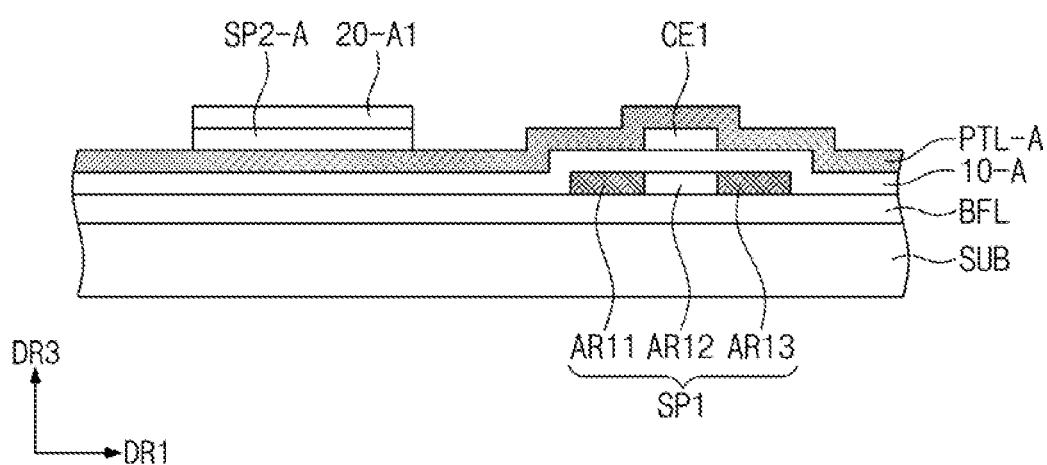

Hereafter, as shown in FIG. 6B, a pre second insulation layer 20-A1 may be formed on the pre protection layer PTL-A. The pre second insulation layer 20-A1 may be formed by deposition, coating, or printing an organic material and/or an inorganic material on the pre protection layer PTL-A, and then by patterning the formed pre second insulation layer 20-A1. The pre second insulation layer 20-A1 may be an insulation pattern 20-1 covering at least the pre second semiconductor pattern SP2-A.

Figure 6C:
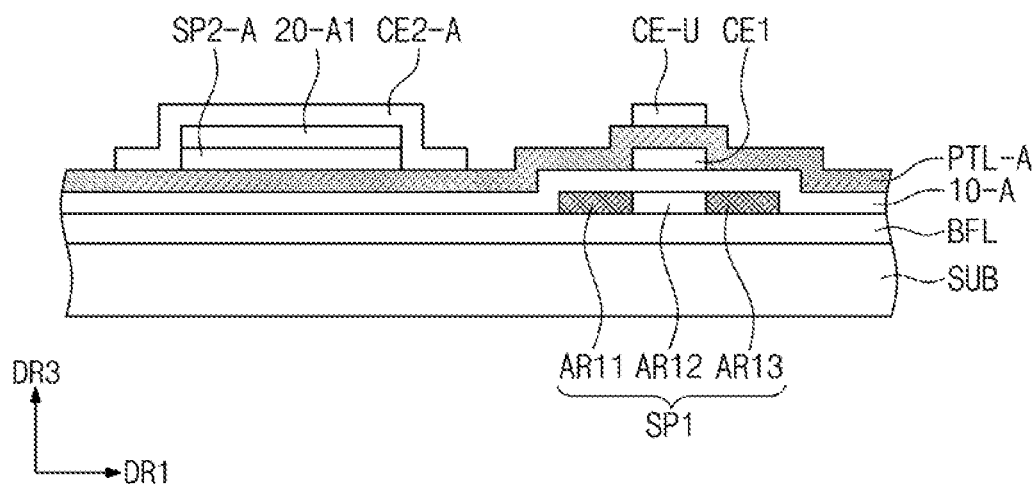

Hereafter, as shown in FIG. 6C, a second conductive pattern may be formed on the pre protection layer PTL-A. The second conductive pattern may include a pre second control electrode CE2-A, and the upper electrode CE-U. The pre protection layer PTL-A may cover an upper surface and a side surface of the pre second insulation layer 20-A1 in FIG. 6C, and may cover a side surface of the pre second semiconductor pattern SP2-A.

The pre second control electrode CE2-A may be formed by depositing, coating, or printing a conductive material on the pre protection layer PTL-A, and then by patterning the formed conductive material.

The upper electrode CE-U may be formed to overlap the first control electrode CE1. The upper electrode CE-U and the pre second control electrode CE2-A may be simultaneously formed using one mask.

Figure 6D:
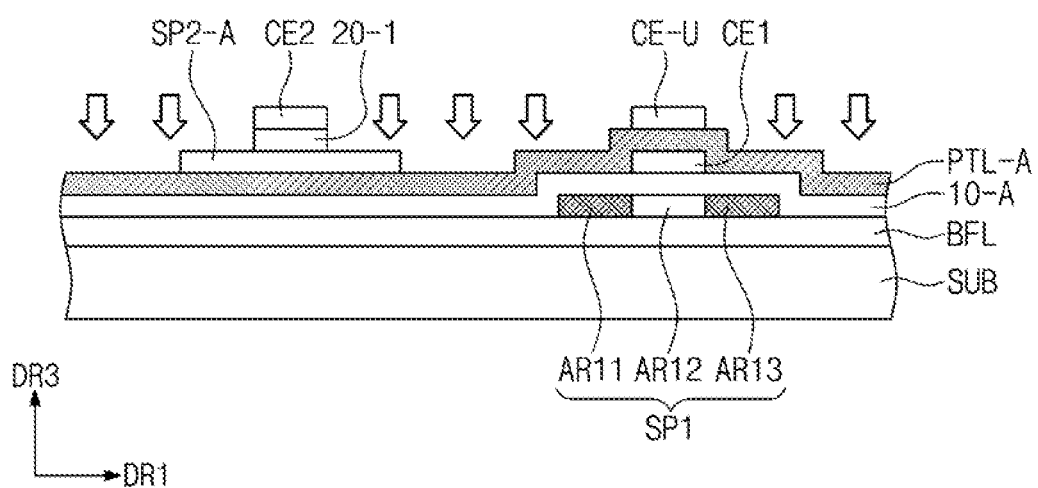
Figure 6E:
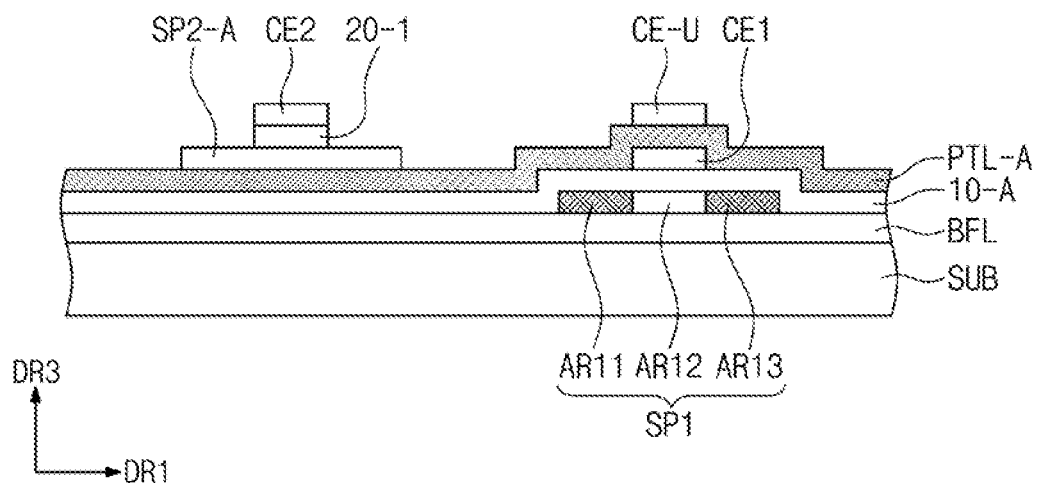

Hereafter, as shown in FIG. 6D and FIG. 6E, the second control electrode CE2 and the second insulation pattern 20-1 may be formed. The second control electrode CE2 may be formed by patterning the pre second control electrode CE2-A. Meanwhile, this may be illustrated by way of another example. The second control electrode CE2 may be simultaneously formed with the upper electrode CE-U.

The second insulation layer 20-1 may be formed by patterning the pre second insulation layer 20-A1. The second insulation layer 20-1 may be patterned using the second control electrode CE2 as a mask. As described above, injected etching gas ET may remove a portion of the pre second insulation layer 20-A1, which may be exposed and patterned by the second control electrode CE2 as a mask. Accordingly, the second insulation layer 20-1 may have a shape of an insulation pattern arranged along an end portion of the second control electrode CE2. For example, the second insulation layer 20-1 may have substantially the same shape as the second control electrode CE2 when viewed in the direction of DR3.

Meanwhile, while the etching gas ET is etching the pre second insulation layer 20-A1, the pre protection layer PTL-A may cover the pre first insulation layer 10-A. As described above, the pre protection layer PTL-A may be formed of a material having a substantially low etch rate with respect to the etching gas ET, and the etching gas ET may have a large etch selectivity for the pre second insulation layer 20-A1. According to a method of manufacturing a semiconductor device according to an exemplary embodiment of the present inventive concept, when the second insulation layer 20-1 is formed, the pre first insulation layer 10-A may be prevented from being damaged by the etching gas ET due to the presence of the pre protection layer PTL-A.

Figure 6F:
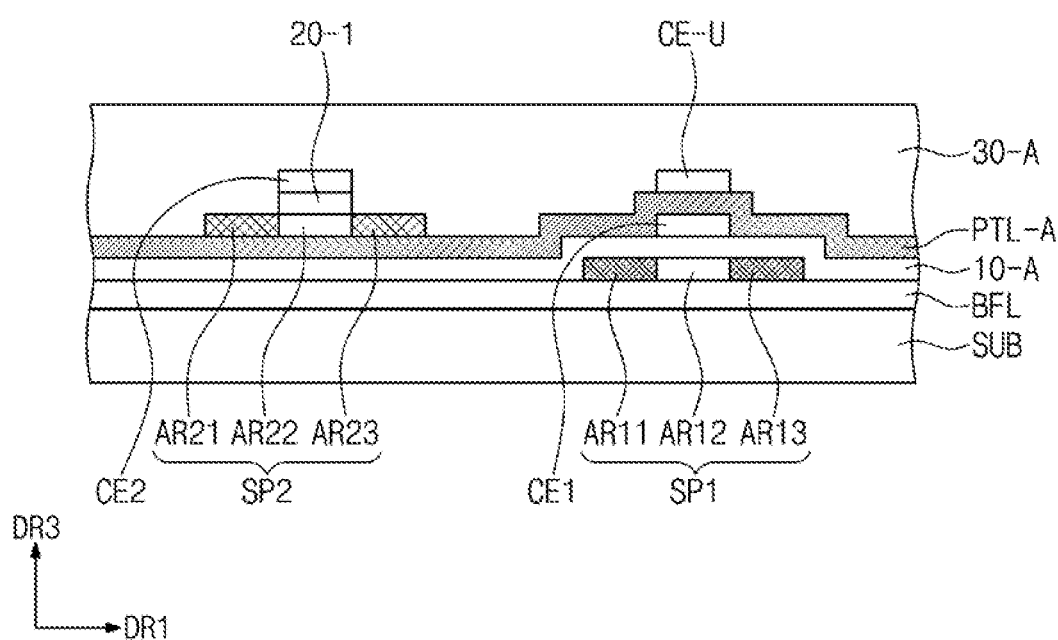

Hereafter, as shown in FIG. 6F, the initial third insulation layer 30-A is formed. The initial third insulation layer 30-A may be formed by depositing, coating, or printing an inorganic material and/or an organic material on the pre protection layer PTL-A. The initial third insulation layer 30-A may be formed to be thick enough to cover the second control electrode CE2 and the upper electrode CE-U, and to have a flat surface formed on an upper side of the second control electrode CE2 and the upper electrode CE-U.

Meanwhile, at least a portion of the pre second semiconductor pattern SP2-A may be exposed from the second insulation layer 20-1, and reduced to formed the second semiconductor pattern SP2, which may be divided into the first area AR21, the second area AR22, and the third area AR23. A detailed explanation thereof is redundant with the description of the FIG. 5G, and therefore will be omitted.

Figure 6G:
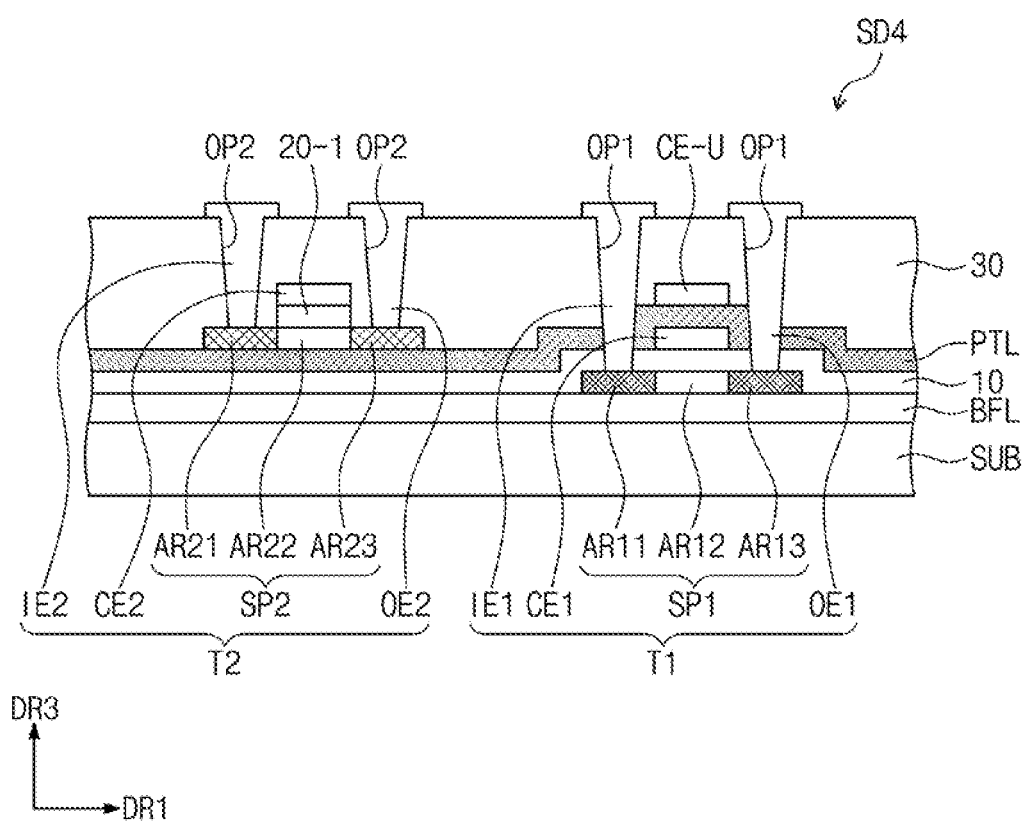

Hereafter, as shown in FIG. 6G, a first insulation layer 10, a protection layer PTL, and a third insulation layer 30 may be formed by forming first penetration portions OP1 and second penetration portions OP2, and a first transistor T1 and a second transistor T2 may be formed by forming the first input electrode IE1, the first output electrode OE1, the second input electrode IE2, and the second output electrode OE2 on the third insulation layer 30. A detailed explanation thereof corresponds to FIG. 5G, and a redundant explanation will be omitted.

According to an exemplary embodiment of the present inventive concept, in the process of forming the second insulation layer 20-1, the first insulation layer 10 may be prevented from being damaged by including the process of forming the protection layer PTL on the first insulation layer 10. Therefore, the process reliability of the first insulation layer 10 may be improved.

According to an exemplary embodiment of the present inventive concept, in a process for manufacturing a semiconductor device including different semiconductor patterns, an insulation layer may be prevented from being damaged in the subsequent process. Accordingly, current leakage is minimized and short circuits may be prevented.

Also, according an exemplary embodiment of the present inventive concept, a semiconductor device including an element with improved reliability may be provided by protecting an insulation layer in a subsequent process.

The above-disclosed subject matter is to be considered illustrative and not restrictive, and the appended claims are intended to cover all such modifications, enhancements, and other exemplary embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A semiconductor device, comprising:
   a base substrate;
   a first transistor disposed on the base substrate, the first transistor comprising a first control electrode, and a first semiconductor pattern that includes a crystalline semiconductor,
   a second transistor disposed on the base substrate, the second transistor comprising a second control electrode, and a second semiconductor pattern that includes an oxide semiconductor;
   a first insulation layer disposed above the base substrate;
   a protection layer disposed above the first insulation layer;
   a second insulation layer disposed above the protection layer and between the second semiconductor pattern and the second control electrode;
   a first capacitor electrode disposed above the first insulation layer and below the protection layer;
   a second capacitor electrode disposed above the first capacitor electrode and the protection layer; and a third insulation layer disposed directly on upper surfaces of the protection laver, and on side surfaces of the second capacitor electrode and the second insulation layer, wherein the second semiconductor pattern and the second control electrode are disposed above the protection layer, and the first control electrode is covered by the protection layer.

2. The semiconductor device of claim 1, wherein the protection layer is disposed between the first semiconductor pattern and the second semiconductor pattern and that includes a metal oxide, wherein the protection layer comprises a material having a first etch selectivity that is different from a second etch selectivity of the second insulation layer, and wherein the first insulation layer is disposed between the first semiconductor pattern and the first control electrode.

3. The semiconductor device of claim 1, wherein the second semiconductor pattern is disposed above the protection layer, the second control electrode is disposed above the second semiconductor pattern, and wherein the first semiconductor pattern and the second semiconductor pattern are disposed on different layers with the protection layer therebetween.

4. The semiconductor device of claim 1, wherein the protection layer is disposed above the first control electrode.

* * * * *